(12) United States Patent
Marinissen et al.

(10) Patent No.: US 7,475,317 B2
(45) Date of Patent: Jan. 6, 2009

(54) AUTOMATIC TEST PATTERN GENERATION

(75) Inventors: Erik Jan Marinissen, Eindhoven (NL); Hubertus Gerardus Hendrikus Vermeulen, Eindhoven (NL); Hendrik Dirk Lodewijk Hollmann, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 322 days.

(21) Appl. No.: 10/557,965

(22) PCT Filed: May 19, 2004

(86) PCT No.: PCT/IB2004/050749

§ 371 (c)(1),
(2), (4) Date: Nov. 17, 2005

(87) PCT Pub. No.: WO2004/104608

PCT Pub. Date: Dec. 2, 2004

(65) Prior Publication Data

US 2006/0259835 A1   Nov. 16, 2006

(30) Foreign Application Priority Data

May 23, 2003   (EP)   ................................. 03076585

(51) Int. Cl.
*G01R 31/28* (2006.01)

(52) U.S. Cl. ........................ 714/738; 714/728; 714/739; 714/742

(58) Field of Classification Search ................. 714/738, 714/728, 739, 742

See application file for complete search history.

(56) References Cited

U.S. PATENT DOCUMENTS 5,636,229 A      6/1997   Eerenstein et al.
7,287,205 B2 *  10/2007   Lin et al. .................... 714/738

OTHER PUBLICATIONS

Amitava Majumdar, et al, Ground Bounce Consideration in DC Parametric Test Generation Using Boundary Scan, IEEE VLSI Apr. 1998, pp. 86-91.*
William H. Kautz, Testing of Faults in Wiring Interconnects IEEE vol. C-23, No. 4, Apr. 1974, pp. 358-363.*
Hans Peter Richter, et al, Boundary-Scan Test Triumphs Over Ground-Bounce, Sep. 1997, pp. 1-5.*
Hollmann et al., Optimal Interconnect ATPG Under a Ground-Bounce Constraint, Sep. 30, 2003, vol. 2, pp. 369-378.*
Erik Jan Marinissen, et al: Minimizing Pattern Count for Interconnect Test Under a Ground Bounce Constraint, IEEE Design & test of Computers, vol. 20, No. 2, Mar. 2003, pp. 8-18, XP001164746.

(Continued)

*Primary Examiner*—Jacques Louis-Jacques
*Assistant Examiner*—John J Tabone, Jr.

(57) ABSTRACT

A method of generating digital test patterns for testing a number of wiring interconnects is described. A first set of test patterns is generated; the number of test patterns in the first set is related to said number of wiring interconnects, and defines a first set of code words. From the first set of code words, a second set of code words is selected. The number of code words in the second set is equal to said number of wiring interconnects, and the selection of the second set of code words is such that the sum of the transition counts for the code words in the second set is minimized.

11 Claims, 20 Drawing Sheets

OTHER PUBLICATIONS

Najmi Jarwala, et al: A New Framework for Analyzing Test Generation and Diagnosis Algorithms for Wiring Interconnects, IEEE International Test Conf. 1989, pp. 63-70.

Paul T. Wagner: Interconnect Testing with Boundary Scan, IEEE ITC, Oct. 1987, pp. 52-57.

Erik Jan Marinissen, et al: Incorporating a Ground-Bounced Preventing Constraint into Wiring Interconnect Test Pattern Generation Algorithms, 1st IEEE International Board Test (BTW '02) Oct. 2002, pp. 1-8, XP002259063.

* cited by examiner

FIG. 4A (30) — transition count

| | | | | | | | | transition count |
|---|---|---|---|---|---|---|---|---|
| $c_1$ | 1 | 1 | 1 | 0 | 0 | 0 | 0 | 1 |
| $c_2$ | 1 | 1 | 1 | 0 | 0 | 0 | 1 | 2 |
| $c_3$ | 1 | 1 | 0 | 1 | 0 | 1 | 0 | 5 |
| $c_4$ | 1 | 1 | 0 | 0 | 1 | 0 | 1 | 2 |
| $c_5$ | 0 | 0 | 1 | 1 | 0 | 0 | 0 | 2 |
| $c_6$ | 0 | 1 | 0 | 1 | 0 | 1 | 1 | 5 |
| $c_7$ | 0 | 0 | 0 | 1 | 1 | 1 | 1 | 2 |
| $c_8$ | 0 | 0 | 1 | 1 | 1 | 1 | 1 | 1 |

| | $p_6$ | $p_5$ | $p_4$ | $p_3$ | $p_2$ | $p_1$ |
|---|---|---|---|---|---|---|
| $c_1$ | 1 | 1 | 0 | 0 | 0 | 0 |
| $c_2$ | 1 | 1 | 0 | 0 | 0 | 1 |
| $c_4$ | 1 | 0 | 0 | 0 | 1 | 1 |
| $c_5$ | 0 | 1 | 1 | 1 | 0 | 0 |
| $c_8$ | 0 | 0 | 1 | 1 | 1 | 1 |
| | 2 | 2 | 1 | 2 | 2 | 1 |

FIG. 4B Prior Art

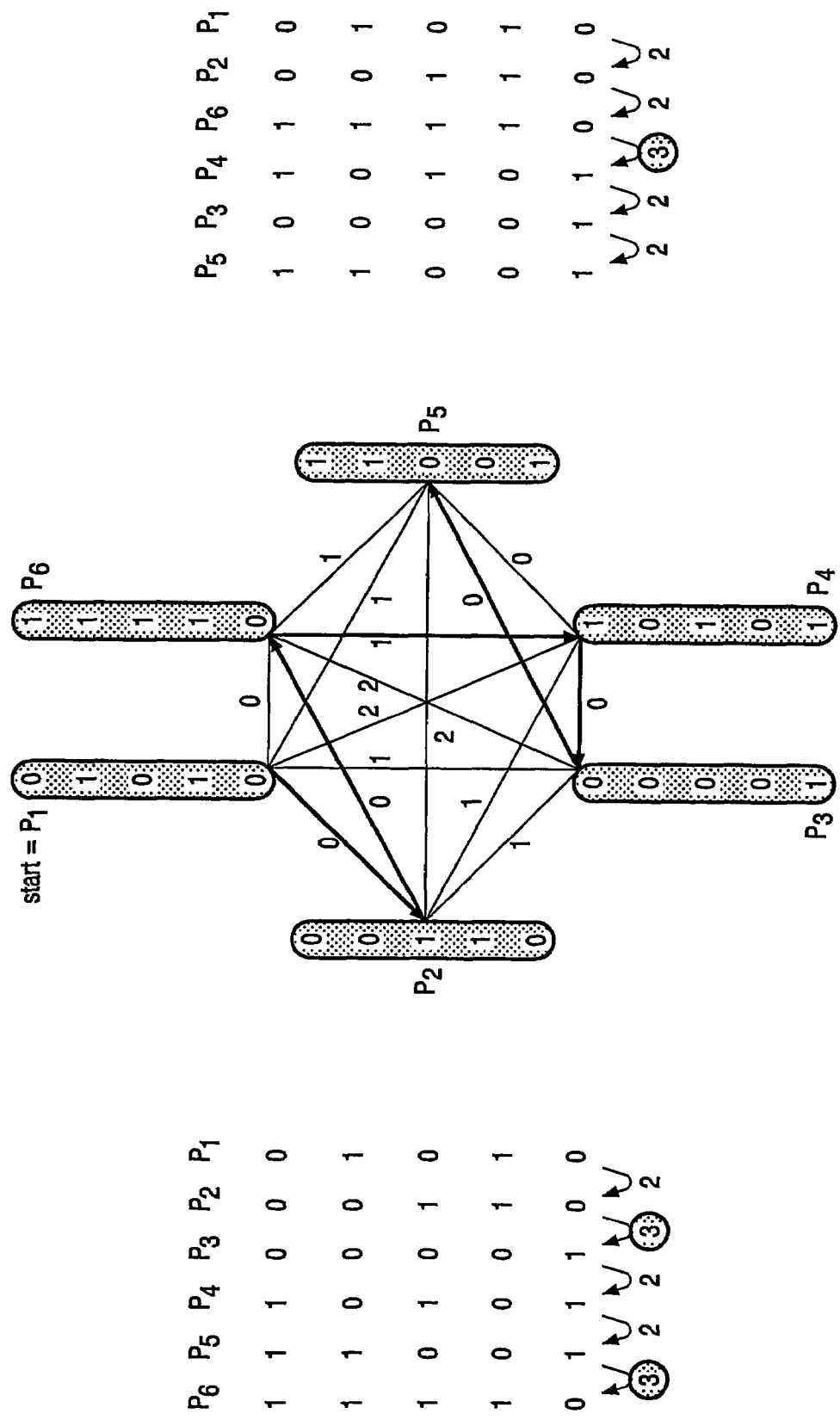

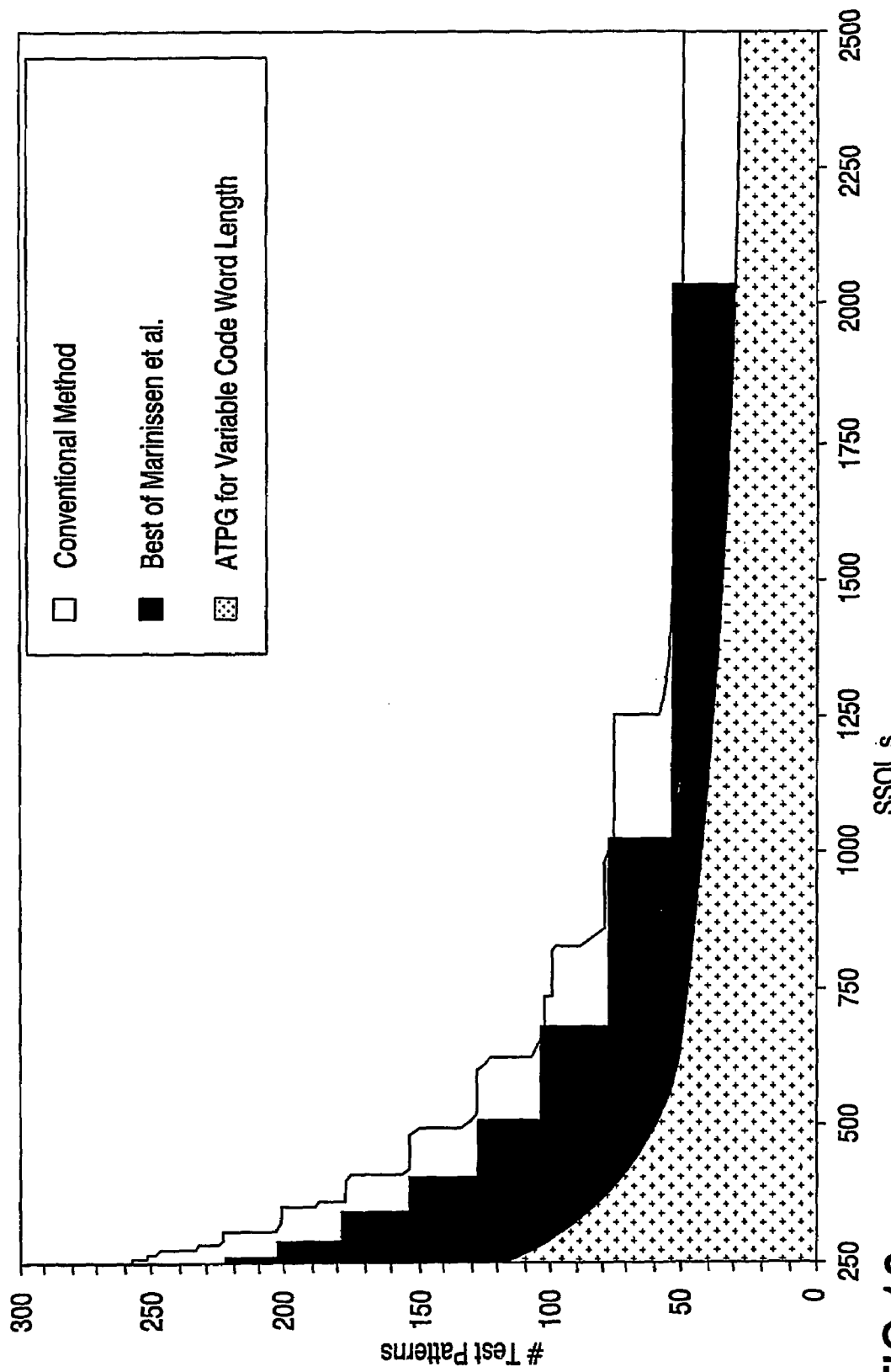
FIG. 12a  $k = 5,000$

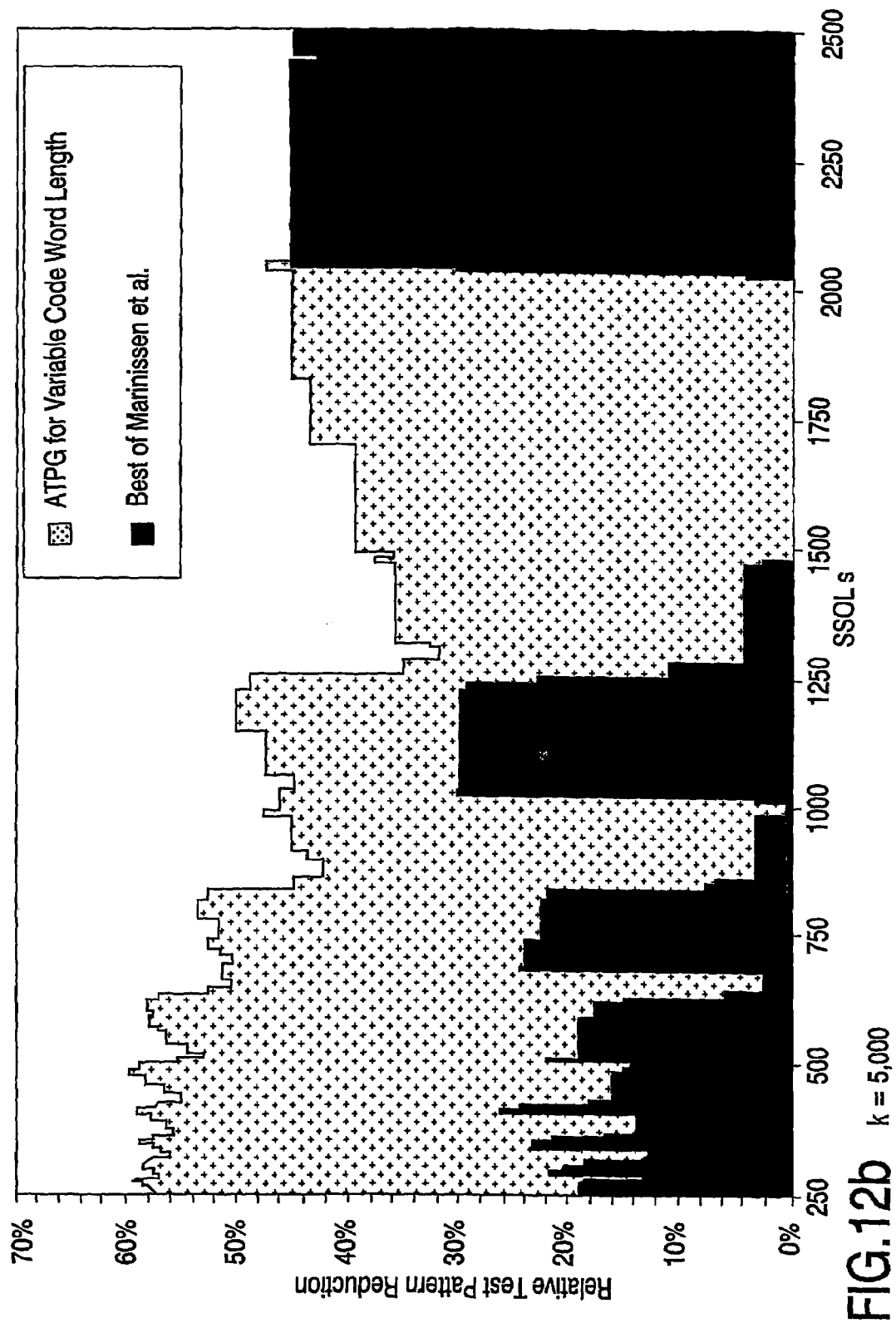
FIG.12b  k = 5,000

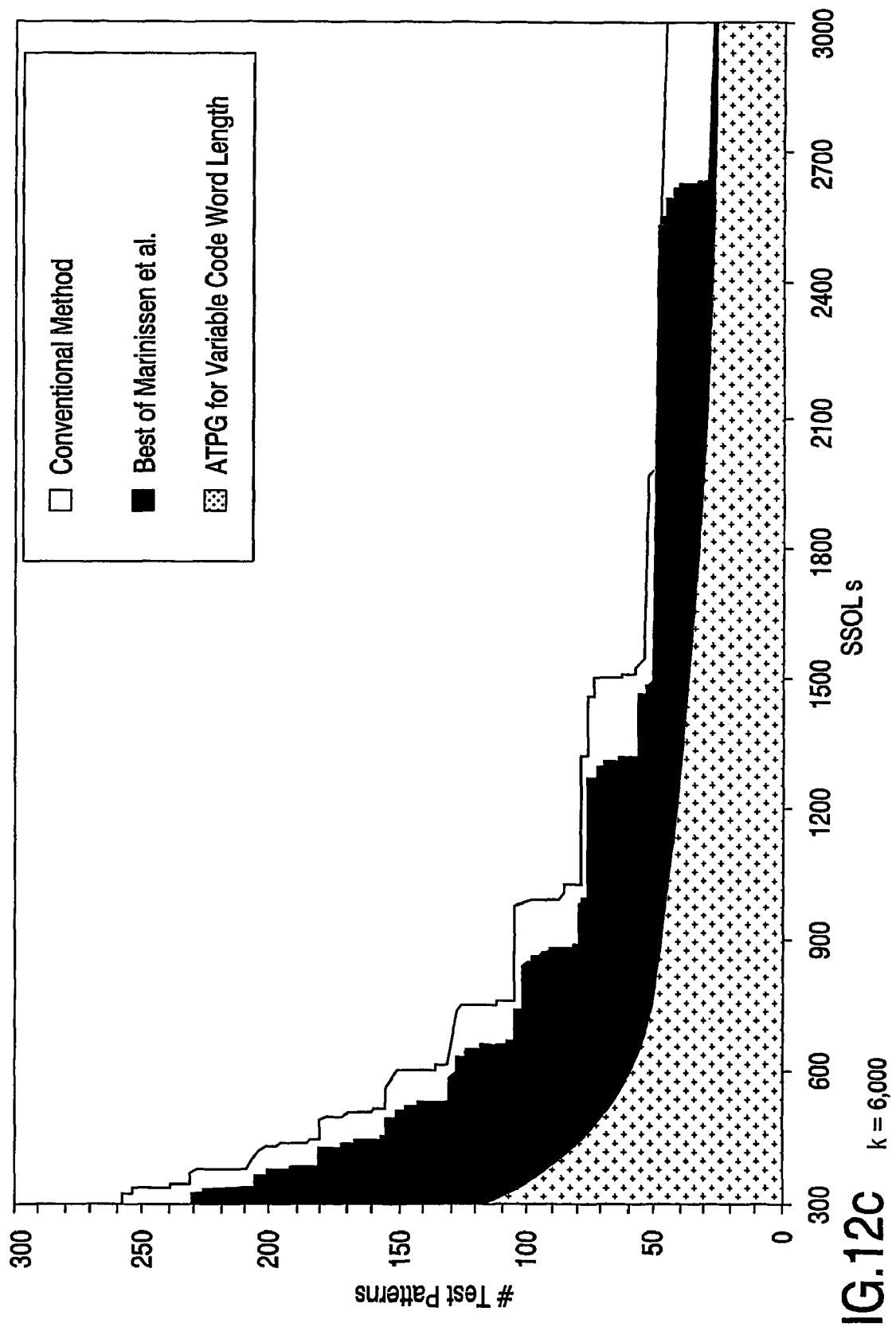
FIG.12C  k = 6,000

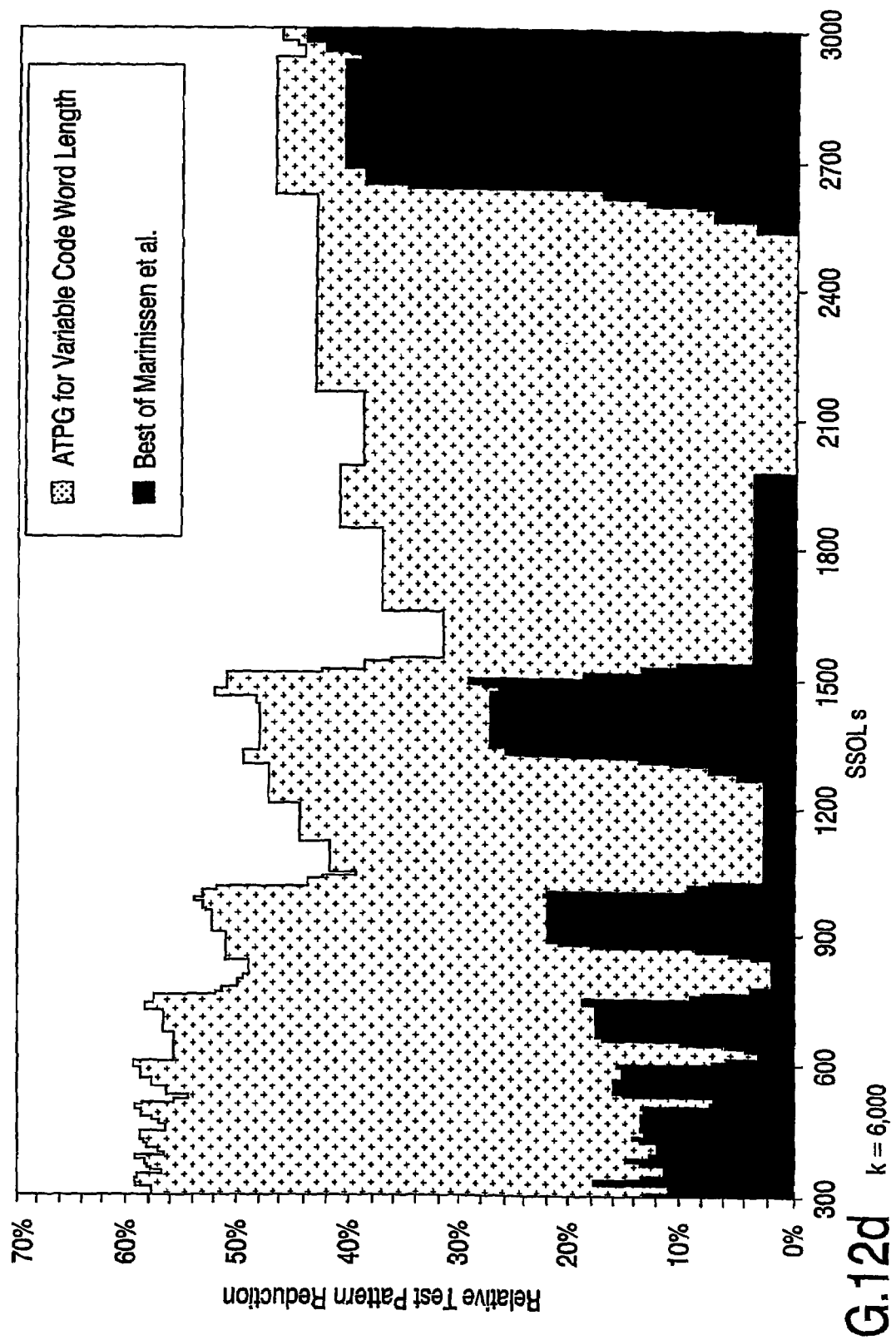
FIG. 12d  k = 6,000

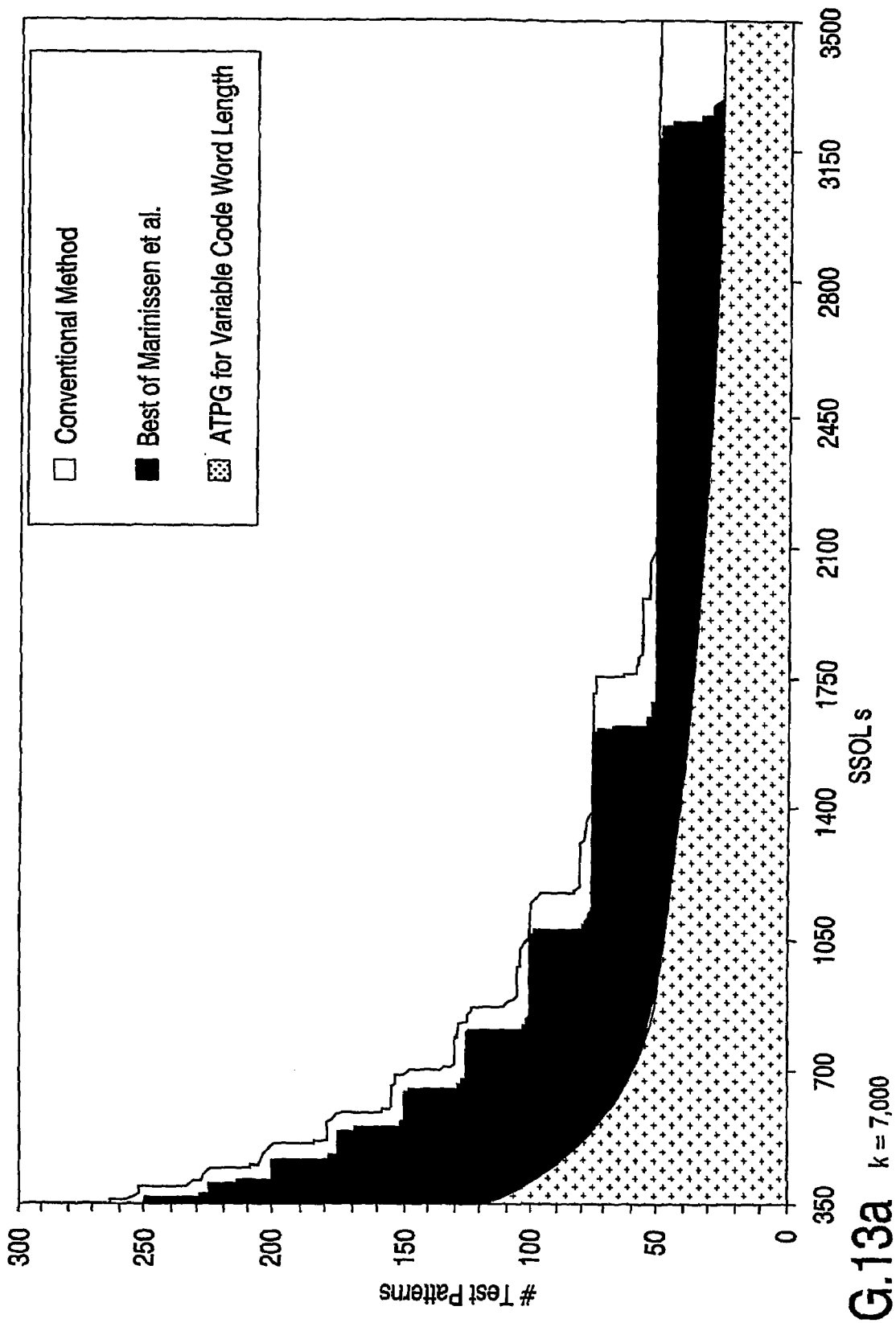
FIG.13a  k = 7,000

AUTOMATIC TEST PATTERN GENERATION

The present invention relates to automatic test pattern generation, and in particular to test pattern generation that can prevent ground-bounce during testing of integrated circuits.

In digital systems, there are usually a large number of wiring interconnects between components. It is an important part of the design and manufacturing process to be able to test these interconnects using known test signals. The interconnects will be referred to a "nets" in this specification.

Many test generation algorithms have been proposed previously. For example, see José T de Sousa and Peter Y K Cheung, "Boundary-Scan Interconnect Diagnosis", Kluwer Academic Publishers, Dordrecht, The Netherlands, 2001. The objective of test generation algorithms is to generate the smallest possible set of test patterns, with certain minimum detection and diagnostic properties. Fault models that are typically addressed by such test generation algorithms are single-net shorts and multiple-net bridges.

In order to test a number of interconnect wires (nets) between two or more digital components, combinations of digital test stimuli are applied to net inputs, the responses are observed at net outputs, and compared to expected responses. It is assumed that there is fall control over the inputs of the nets, and that the outputs of the nets are fully observable.

In the following description, the following terms for the test stimuli are used. These terms are illustrated in FIG. 1 of the accompanying drawings.

Test Pattern: A test pattern 2 is a set of test data bits that are applied simultaneously, in parallel, to the nets under test. In FIG. 1, the test patterns are shown as the columns of the test data. Test patterns are sometimes known as Parallel Test Vectors (PTVs).

Code Word: A code word 4 is the list of test data bits applied serially to an individual net during the test. In FIG. 1, code words are the rows in the test data. Code words are sometimes known as Sequential Test Vectors (STVs).

Jarwala and Jau (Najimi Jarwala and Chi W Jau, "A New Framework for Analyzing Test Generation and Diagnosis Algorithm for Wiring Interconnect", Proceedings IEEE International Test Conference (ITC), pages 63-70, October 1989) described the following deterministic fault model for wiring interconnects:

Multi-net faults are bridging faults that create shorts between two or more nets, and which have the following characteristics:

Wired-OR: In case of dominant '1' drivers, the short behaves like a logical 'wired OR' between the shorted nets.

Wired-AND: In case of dominant '0' drivers, the short behaves like a logical 'wired AND' between the shorted nets.

Strong-Driver: A specific driver dominates the shorts, and hence the shorted nets follow the dominant driver.

Single-net faults include "stuck-at" faults and "stuck-open" faults on a single net, have the following characteristics:

Stuck-at-0: The fault is such that the data value on the net is always read as logical '0'.

Stuck-at-1: The fault is such that the data value on the net is always read as logical '1'.

The requirement for testing shorts is that every net must get a unique code word. If the nets are fault-free, each response is unique. In case of a short, the nets involved in that short have the same response. Therefore, these responses are no longer unique and the short is detected. William Kautz (William H Kautz. Testing of Faults in Wiring Interconnects. IEEE Transactions on Computers, Vol C-23 (No 4): 358-363, April 1974) proposed a test for shorts which has become known as the Counting Sequence Algorithm. A simple binary counting algorithm generates the code words. For k nets, $\log_2 k$ test patterns are required. The Counting Sequence Algorithm guarantees the detection of all shorts with the minimum number of test patterns.

In order to guarantee that every net is tested for stuck-at-0 opens, every code word needs to contain at least one '1'. Likewise, for stuck-at-1 faults, every code word needs to contain at least one '0'. The Counting Sequence Algorithm does not guarantee this. Therefore, Goel and McMahon (P Goel and M T McMahon, "Electronic Chip-In-Place Test". Proceedings IEEE International Test Conference (ITC), pages 83-90, October 1982) proposed a test generation algorithm that has become known as the Modified Counting Sequence Algorithm. The main idea is that open faults can be detected if we forbid the all-zeros and all-ones code words. Hence, for k nets, $\log_2(k+2)$ test patterns are needed, which can be generated again by a simple binary counting algorithm, which starts at one, instead of at zero. The Modified Counting Sequence Algorithm guarantees the detection of all shorts and opens with the minimum number of test patterns.

Another interconnect text generation algorithm, published by Eerenstein and Muris (Lars Eerenstein and Math Muris, "Method for Generating Test Patterns to Detect an Electric Short circuit, a Method for Testing Electric Circuitry While Using Test Patterns So Generated, and a Tester Device for Testing Electric Circuitry with such Test Patterns", U.S. Pat. No. 5,636,229), is known as the LaMa Algorithm. The LaMa algorithm is based on the Modified Counting Sequence Algorithm, but increments by three rather than by one. The LaMa algorithm requires $\log_2(3k+2)$ test patterns for k nets.

The above-mentioned test generation algorithms guarantee detection of faults. However, next to detection of faults, diagnostic resolution is often another important property of a test. Jarwala and Jau described the situation of aliasing, which obscures the diagnostic resolution. Aliasing occurs if the faulty response of a faulty net is equal to the fault-free response of another, fault-free net. In this case, we cannot determine whether the fault-free net also suffers from the fault at the fault net. Paul T. Wagner, ("Interconnect Testing with Boundary Scan", Proceedings IEEE International Test Conference (ITC), pages 52-57, October 1987) presented the True/Complement Test Algorithm, which enhances the (Modified) Counting Sequence Algorithm in order to prevent aliasing. Wagner's method applies all test patterns of the original Counting Sequence Algorithm, followed by the same test patterns with inverted values. Due to the inverted test patterns, all-zeros and all-ones code words will not be generated. Therefore, it is not necessary to exclude the numbers 0 and k−1 in the counting sequence. Hence, the True/Complement Test Algorithm requires $2 \log_2 k$ test patterns. The True/Complement Test Algorithm guarantees that every code word contains an equal number of zeros and ones, due to the inversion.

In case of a 'Wired-OR' fault with another net, in the response word the number of ones is increased and the number of zeros is decreased. Likewise, in case of a 'Wired-OR' fault with another net, in the response word the number of ones is increased the number of zeros is decreased. Likewise, in case of a 'Wired-AND' fault with another net, the number of zeros is increased and the number of ones is decreased. In case of a stuck-at open fault, all response values will be either all-zeros or all-ones. Hence, in every fault case the numbers of zeros and ones changes, such that the response word does not contain an equal number of zeros and ones any more. Therefore, a faulty response will never be equal to a fault-free response of another net, and hence, the True/Complement Test Algorithm is aliasing-free. In the example of FIG. 2(d), with k=4, we need 2.⌈²log4⌉=4 test patterns. The code words are 1100, 1001, 0110 and 0011, and they can be arbitrarily assigned to the four nets. FIG. 1 illustrates True/Complement Test Algorithm test patterns for the five nets (net 1 ... net 5) shown.

Recently, preventing ground bounce has become a new constraint for test generation algorithms. Ground bounce refers to the phenomenon of shifting ground and power voltage levels, for example between the IC-internal ground and power levels and those at the board, and can be caused by a large number of values switching simultaneously on an IC. Ground bounce can be prevented by introducing an upper limit on the amount of switching activity between consecutive test pattern test patterns. This limit is known as the Simultaneous Switching Output Limit (SSOL).

During the regular operation of an IC, there is much internal switching activity amongst transistors. Too much activity can cause surges in current demand from the power-supply and cause the IC-internal power or ground levels to fluctuate considerably. This in turn, can cause spurious pulses to be generated on critical signals, such as system clocks or master resets, thereby causing spurious behavior in the IC. For example, see Hans Peter Richter and Norbert Münch, "Boundary-Scan Test Triumphs Over Ground-Bounce", Test & Measurement World Europe, August/September 1997, or Amitava Majumdar, Michio Komoda, and Tim Ayres, "Ground Bounce Considerations in DC Parametric Test Generation using Boundary Scan", Proceedings IEEE VLSI Test Symposium (VTS), pages 86-91, April 1998.

Ground bounce can have a negative impact on the operation of the IC. If the IC-internal ground voltage level rises to the threshold voltage of the IC-internal logic, there exists the likelihood of invalid logic behavior. In the case of Boundary-Scan-equipped ICs, ground bounce can result in spurious test clocks (TCKs), which, in turn, can cause on-board Boundary-Scan devices to go out of synchronization.

Ground bounce can be prevented by designing ICs (or boards) such that they can handle large amounts of switching activity within the IC (or between ICs on the board). The switching activity during test is typically higher than during normal (non-test) operation. By its very nature, testing sets up sensitive paths through a circuit thereby causing many outputs to change value. In order to save test time, it is often an objective of test generation algorithms to obtain the highest possible fault coverage with a minimum number of test patterns. This increases still further the amount of internal switching activity per test pattern. ICs and boards are designed to handle ground bounce during normal operation and during test operation. In fact, the IEEE 1149.12 Boundary-Scan Standard mandates that there should be no ground-bounce inside the device during all test operations based on the use of the boundary-scan register. The problem is that at board level, with all on-board boundary-scan devices in EXTEST test mode for interconnect testing, there is no guarantee that board-level ground bounce will not occur, even though each device is within its ground bounce specification. In fact, there is a high probability that ground bounce will occur if there are more than a few thousand Boundary-Scan to Boundary-Scan interconnects.

Richter and Münch reported on ground bounce problems during EXTEST testing between 1149.1-compliant ASICs on an industrial telecommunications board. All the ASICs met their electrical ground bounce specification and simulation confirmed correct operation of the ASICs under normal operation with at most 50% of the ASIC outputs switching simultaneously. The ASIC designers did not consider the possibility that many (or even all) boundary-scan outputs might switch simultaneously (worst-case EXTEST), even though that was what happened during board testing.

Ground bounce can be prevented at board level by controlling the degree of switching activity in the test patterns generated and applied across the interconnects. This can be done by introducing an upper limit on how many Boundary-Scan outputs can be simultaneously switched in the transition from one test pattern to the next. In this description, this upper limit is referred to as the Simultaneously-Switching Outputs Limit (SSOL). In general, the SSOL should be derived and defined by the board designer responsible for the electrical design of the board. Many vendors of board-level interconnect ATPG tools have added SSOL constraints into their products.

The SSOL constraint restricts the maximum number of data bit transitions between two consecutive test patterns. The number of bit transitions between consecutive test patterns is known as the Hamming distance, and is illustrated in FIG. 2. In FIG. 2(a) six test patterns ($p_1$ to $p_6$) are shown and the Hamming distances 6 between consecutive test patterns are also shown. It can be seen that two of the consecutive pairs of test patterns have Hamming distances greater than assumed level of SSOL of 2.

It is therefore necessary to modify the test patterns in order to remove these violations. A previously considered method for removing the violations is to insert additional test patterns between the violating pairs of test patterns. In the present case, as shown in FIG. 2(b), two additional test patterns $p_{2i}$ and $p_{5i}$ are added to remove these violations. All of the pairs of test patterns in FIG. 2(b) have Hamming distances less than the SSOL level.

However, incorporating an SSOL constraint into test generation generally leads to an increase in the number of test patterns, and hence test time, because of the need to insert additional test patterns.

It has been shown in Erik Jan Marinissen, Bart Vermeulen, Henk Hollmann, and Ben Bennetts, Minimizing Pattern Count for Interconnect Tests Under A Ground-Bounce Constraint. IEEE Design & Test of Computers, 20(2), March/April 2003 that the conventional approach of simply inserting additional test patterns to overcome SSOL violations can lead to an unnecessarily large test set. There are two degrees of freedom that can be exploited in order to reduce the number of additional test patterns that need to be inserted, while maintaining all detection and diagnostic properties of the original test set.

The Marinissen et al paper will now be described in more detail in order to describe fully the background to the present invention.

The method will be described with reference to the True/Complement Test Pattern generation algorithm described above, but it will be readily appreciated that the method is able to operate on test patterns generated by any algorithm or approach.

The method uses two basic steps : code word subset selection, and test pattern re-ordering (and insertion). The overall method is illustrated in FIG. 3. At step 10, an automatic test pattern generation algorithm is used to generate a complete set of test patterns.

At step 12(120, 121, 122) code word subset selection is performed using any method (120), a transition count method (121), or a difference count method (122). The results of the selection are fed to a re-ordering step 14, which reorders the test patterns using any method (141), or a greedy method (142) to minimize the number of SSOL violations in the test pattern set. The various methods will be described in more detail below.

Following reordering, additional test patterns can be inserted where necessary (step 15) in order to remove any remaining SSOL violations.

The selection of a code word subset will now be described in more detail.

For k nets, a test generation algorithm requires p(k) test patterns. With p(k) test patterns, the algorithm generates c(k) unique code words, such that k≦c(k). The functions p(k) and c(k) depend on the test generation algorithm. For example, for the True/Complement Test Algorithm p(k) and c(k) are given by the following:

$$\lceil p(k)=2\log_2 k \rceil$$

$$\lceil c(k)=2^{p(k)/2}=2^{\log_2 k} \rceil$$

In many practical cases, the algorithm generates more code words than strictly necessary, i.e., k<c(k), because k, p(k), and c(k) are all integers. This means that the expressions have ceil operators that round off any non-integer values to the nearest higher integer values. These ceil operators cause that in many cases k<c(k).

Accordingly, it is possible to choose a subset of the total number c(k) of generated code words to be applied during the test. Such subset selection will not affect the detection and diagnostic properties of a test, or test time.

There are $$\binom{c(k)}{k} = \frac{c(k)!}{k! \cdot (c(k)-k)!}$$

possible subsets available from which to choose. As an example, consider the True/Complement Test Algorithm for k=257. According to the above, $c(257)=2^{\log_2 257}=2^9=512$. Therefore, there are $$\binom{512}{257} \approx 4.7 \times 10^{152}$$

alternative code word subsets.

The subset selection procedure searches for the subset of code words that leads to the smallest test pattern set without SSOL violations.

The code word subset selection can be performed by one of two heuristic techniques, which will be described below.

The first possible heuristic technique is based upon a transition count, and is illustrated in FIG. 4. The example of FIG. 4 represents the case for k=5, which yields 6 test patterns and eight code words. In FIG. 4(a) a complete set ($c_1$ to $c_8$) of test patterns is shown, together with the count 30 of the number of bit transitions therein. Using the transition count heuristic method, the k(=5) code words that are required are selected as the 5 code words having the lowest transitions counts. Where only a selection of code words having the same transition count is required, the selection is made arbitrarily.

FIG. 4(b) illustrates the selected code words ($c_1$ $c_2$ $c_4$ $c_5$ $c_8$), together with the Hamming distances 30 between consecutive test patterns. In this case, it can be seen that the subset form a test pattern set that has no violations for SSOL=2, and so no further processing would be required. Naturally, and especially for large values of k, reordering and possible insertion could be required.

The second heuristic approach uses a difference count method, and this is illustrated in FIG. 5. FIG. 5(a) shows a complete test pattern set ($c_1$ to $c_{16}$), for the situation when k=9, and SSOL=3, generated using the True/Complement method. Each code word has an associated difference count, which is equal to the number of differences between the bits in the first half of the code word and those in the second half of the code word.

The code words having the lowest difference counts are then selected to provide the correct number k of code words. When a selection between code words having the same difference count is to be made, this selection is made on an arbitrary basis.

FIG. 5(b) shows the selected subset of code words, together with the Hamming distances between consecutive pairs of test patterns. It can be seen that test patterns several of the test pattern pairs fail the SSOL<=3 test, and so further processing will be required. The results of the further processing (reordering), to be described in detail below, are shown in FIG. 5(c).

Reordering and insertion of the test patterns will now be described in more detail.

Reordering of the test patterns is carried out on the subset of code words selected during the previous stage. Accordingly, there are p test patterns and k code words.

Initially, a so-called SSOL Violations Graph is constructed. Such a graph is shown in FIG. 5 and comprises a weighted, fully connected, and undirected graph. The nodes of the graph correspond to the p(k) test patterns. The edge between each pair of nodes is given a weight dependent upon the hamming distance between the nodes in the pair. The weight of an edge represents the number of SSOL violations between those two nodes.

The problem of finding the route through the nodes of the graph can be seen to be a version of the traveling salesman problem (TSP). In terms of the SSOL Violations Graph, it is necessary to find a route through all nodes of the graph, such that the summed weight of the edges encountered along the tour is minimized.

This problem is equal to the optimization variant of the well-known Traveling Salesman Problem, M. R. Garey and D. S. Johnson, Computers and Intractability—A guide to the theory of NP-Completeness, W.H. Freeman and Company, San Francisco, Calif., USA, 1979.

The Traveling Salesman Problem (TSP) is briefly described, and can be summarized as follows. Given a set C of m cities, with distances $d(c_i,c_j)$ for each pair of cities $c_i,c_j \in C$, and a positive integer B. Is there a tour of C having length B of less?

In practical terms, the time needed to compute an optimal solution increase exponentially with the problem instance size. The problem instance size is determined by the number of nodes (test patterns). Fortunately, the problem instance size for board-level interconnect testing is not very large. The number of test patterns is of the order of $\log_2 k$, and hence, even for boards with thousands of nets, there are between 10 to 20 test patterns. Therefore, it seems feasible for most practical problem instances to solve this problem exhaustively, i.e., by enumerating all possible tours in the graph. Alternatively, there are effective and efficient heuristic algorithms for TSP available in the literature, that are able to solve this problem with close-to-optimal solutions in short compute times. For example, see David S. Johnson and Lyle A. McGeoch, "The traveling salesman problem: A case study", in Emile H. L Aarts and Jan-Karel Lenstra, editors, "Local Search in Combinatorial Optimization", pages 215-310, John Wiley & Sons Ltd., Chichester, England 1997.

FIG. 5(b) illustrates a SSOL violations graph for k=5, and s=2, with FIG. 5(a) showing the unordered test pattern set that makes up the nodes of the graph. It can be seen that the unordered test pattern set has two instances of pairs of test patterns which violate the SSOL criterion.

In FIG. 5(b) bold arrows indicate the SSOL-violation-free tour through the graph. FIG. 5(c) shows the corresponding resultant test set, in which the test patterns are ordered according to the minimized SSOL-violation tour in the graph.

After running a TSP Solver, there are two possible outcomes: (1) a tour with summed weight zero is obtained, or (2) a tour with summed weight larger than zero is obtained. In the first case, an ordering of the test patterns that meets the SSOL constraint has been found. In the latter case, an ordering of the test patterns has been found that still has one or more SSOL violations. This might be due to the fact that there is not tour with summed weight zero, or there is such a tour, but the heuristic TSP solver used was not capable of finding it. In any case, it is expected that the number of SSOL violations is relatively low, as minimizing the summed weight of the tour was the objective function of the TSP Solver.

Remaining SSOL violations case be resolved by inserting one or more additional test patterns in between two consecutive test patterns that have an SSOL violation. If consecutive test patterns $p_1$ and $p_2$ have $w(p_1, p_2)$ SSOL violations (with $w(p_1, p_2)>0$), then it is necessary to insert $w(p_1,p_2)/s$ additional test patterns in order to resolve all SSOL violations between those two patterns.

In FIG. 5(c), it can be seen that one pair of test patterns violate the SSOL criterion, and so an additional test pattern must be inserted between those two test patterns to remove this violation.

The Marinissen et al. paper provides equations for theoretical upper and lower bounds for the minimal number of test patterns for k nets under the SSOL constraint s.

It is therefore desirable to provide a test pattern generation algorithm that can incorporate a SSOL constraint, but that also further minimizes the number of test patterns to be generated, and makes use of additional optimization.

Embodiments of the present invention therefore seeks to provide such an algorithm, to provide a method that allows incorporation of SSOL-violation-free consecutive test patterns into any given test generation algorithm.

According to one aspect of the present invention, there is provided A method of generating digital test sets for testing a number of wiring interconnects, each test set comprising a matrix of bits, which matrix defines a first plurality of test patterns and a second plurality of code words, wherein the bits of each test pattern are for application to respective wiring interconnects in parallel with one another, and the bits of successive test patterns for application to an interconnect form a code word for that interconnect, and wherein each code word has a transition count related to a number of bit value transitions therein, the test set having a total transition count related to the sum of the transition counts of the code words in the test set, the method comprising the step of generating a test set which includes more than $2\log_2 k$ test patterns, where k is the number of wiring interconnects generating, and which has a total transition count which is less than a predetermined threshold value, the predetermined threshold value having a predetermined relationship with the number of test patterns in the test set.

Figures 2A, 2B:
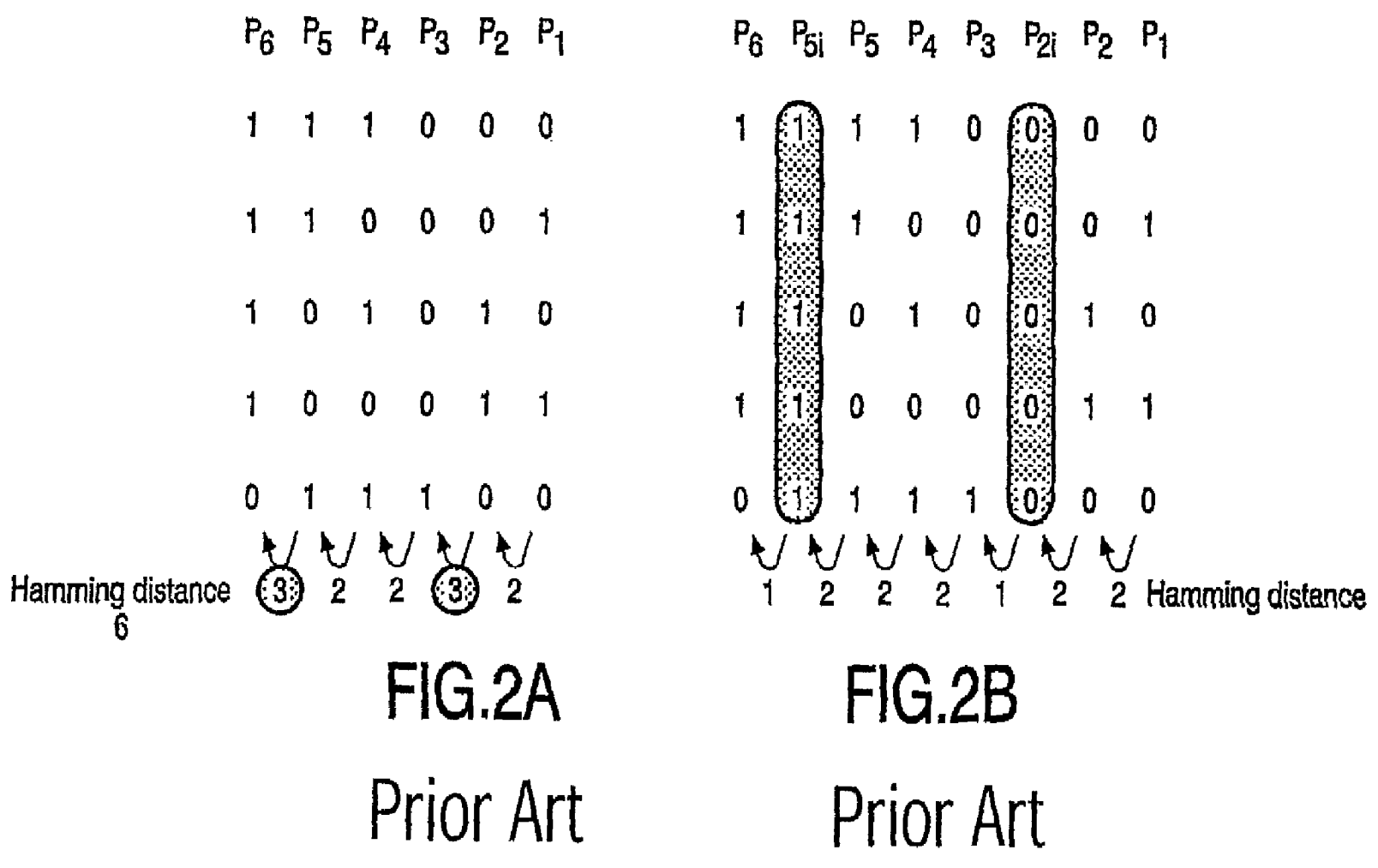

FIGS. 2A and 2B illustrates test stimuli for five nets for the True/Complement Test Pattern Generation Algorithm;

FIGS. 4A and 4B illustrates a first method of code word subset selection;

FIG. 6A-6C illustrates a method for reordering test patterns;

FIG. 12a-12d illustrates test pattern counts; and

FIG. 13a-13d illustrates test pattern count reduction.

A preferred embodiment of the present invention will now be described with reference to the accompanying drawings.

Firstly, a relationship is analyzed between the binary contents of an initial test pattern set and the number of test patterns that need to be inserted to resolve any violations of the maximum Hamming distance constraint for consecutive test patterns.

Figure 1:
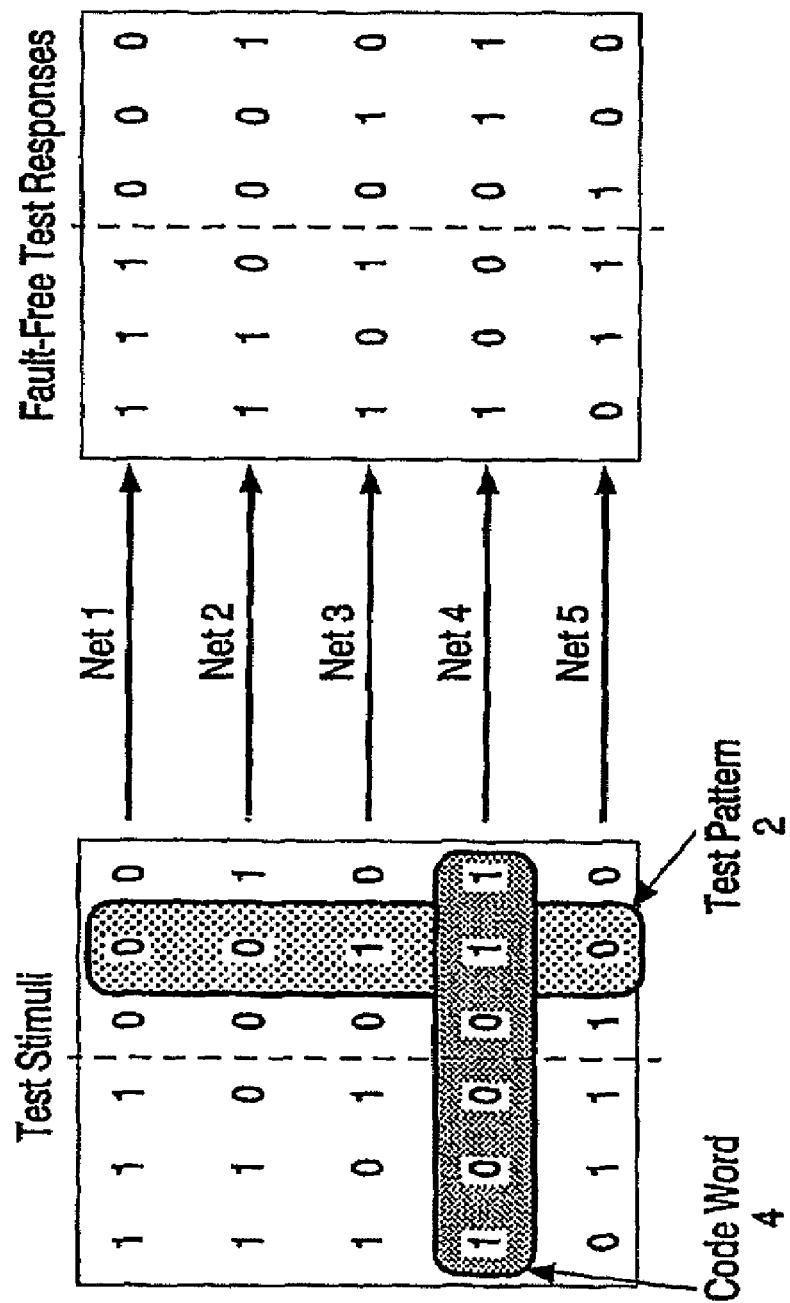
FIG. 1 illustrates test patterns and code words.
Figure 3:
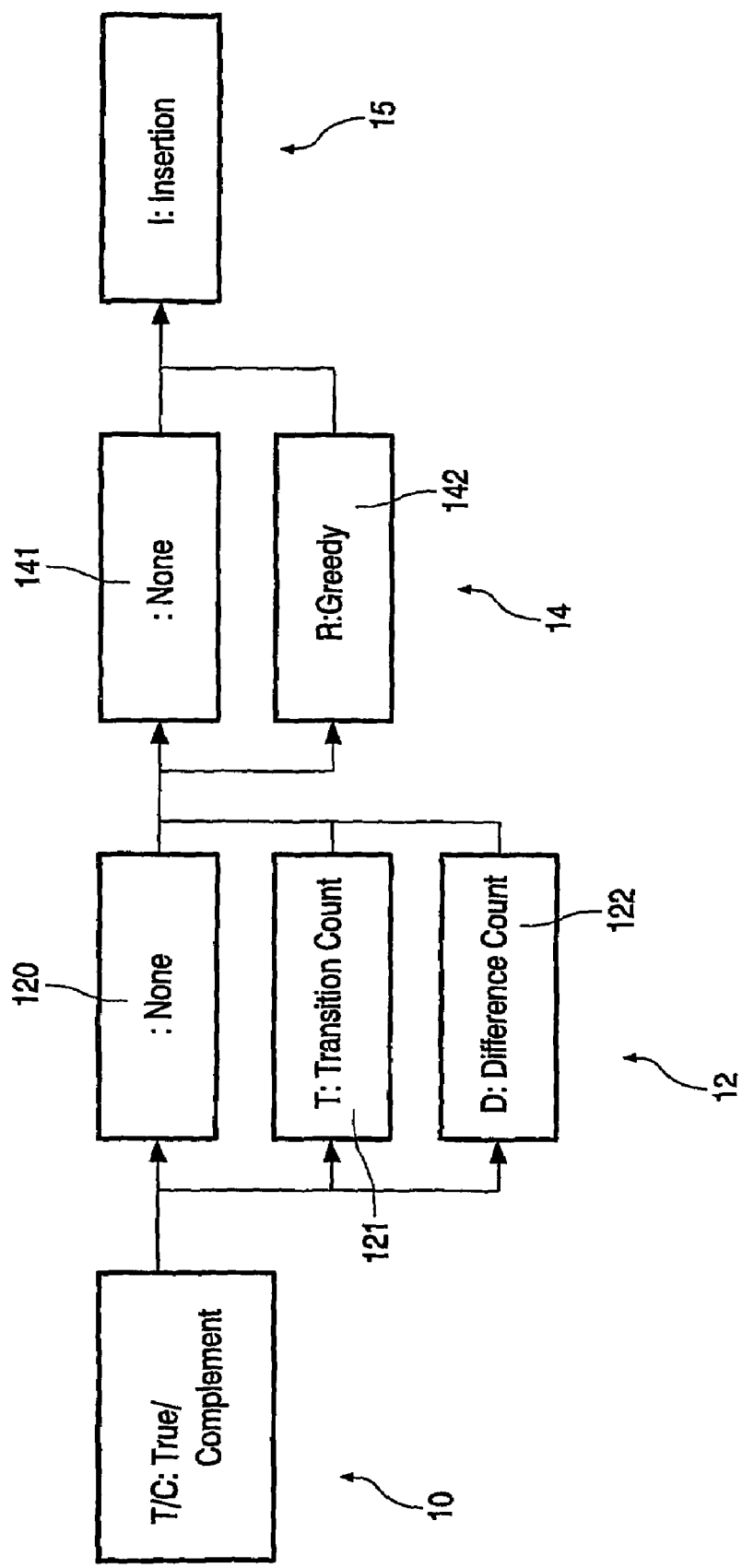
FIG. 3 illustrates a method embodying one aspect of the present invention.
Figure 5A:
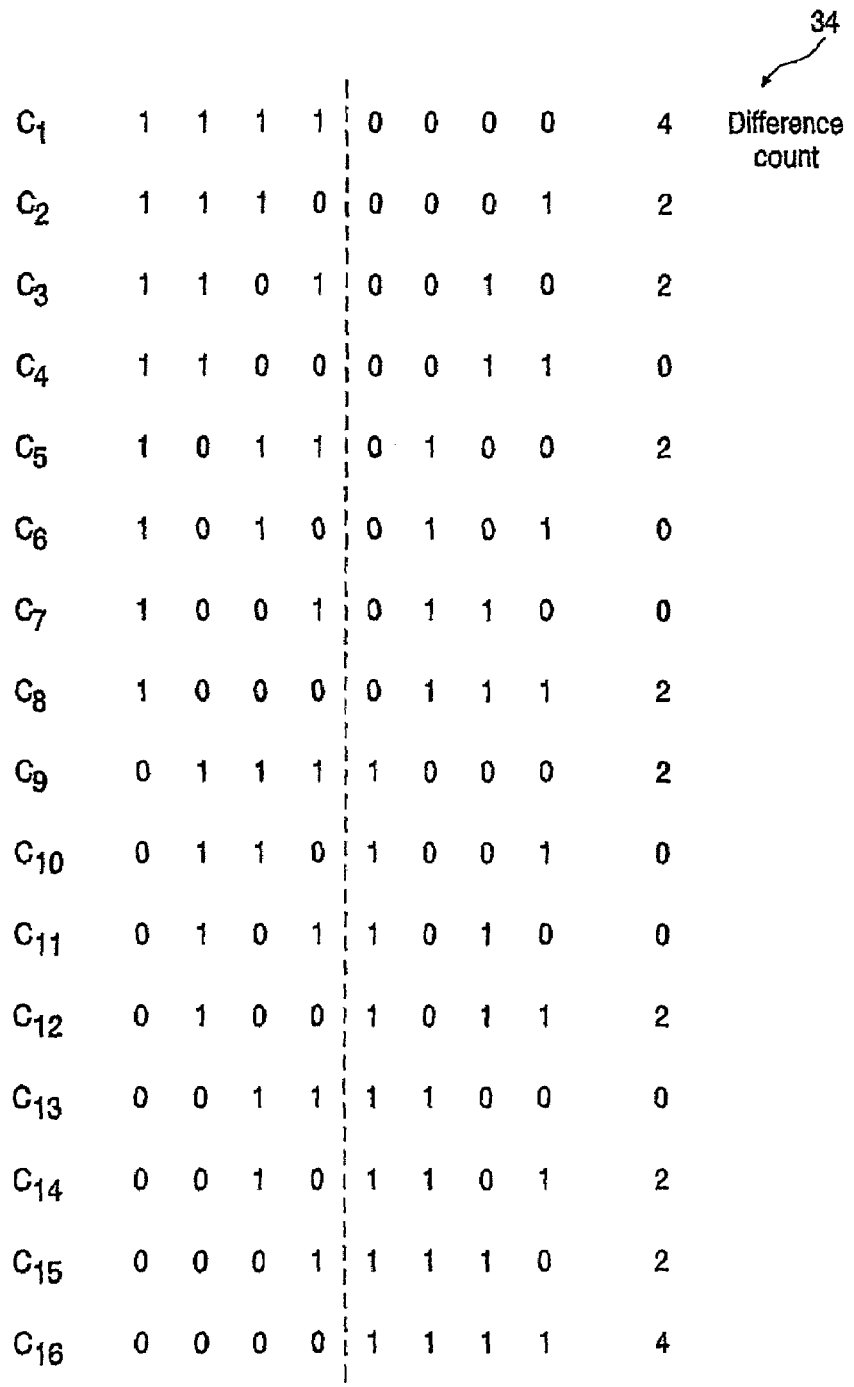
FIG. 5A-5C illustrates a second method of code word subset selection.
Figures 5B, 5C:

FIG. 3(a) illustrates a test pattern matrix C, where the rows correspond to the k code words and the columns to the b test patterns. The k code words are denoted by $C_1, \ldots C_k$. $C_{i,j}$ refers to bit j in code word $C_i$, for $1 \leq i \leq k$ and $1 \leq j \leq b$. The test patterns are denoted by $p_1 \ldots p_b$, where $p_j = (C_{1,j}, \ldots, C_{k,j})$ is the jth column of the test pattern matrix C.

As transitions and transition-counts are important in the analysis, an alternative notation of test pattern matrix C is used. A transition matrix T is calculated, which comprises a $k \times (b-1)$ matrix T and k initial code word values $C_{i,1}$. A transition matrix T is illustrated in FIG. 3(b). The relationship between the matrices C and T is given by:

$$T_{i,j} = \begin{cases} 1, & \text{if } C_{i,j} \neq C_{i,j+1} \\ 0, & \text{otherwise} \end{cases};$$

For j=1 ... b−1, the Hamming distance between consecutive test patterns $p_j$ and $p_{j+1}$ is defined as:

$$d_j = d_H(p_j, p_{j+1})$$

For simplicity, it is assumed that consecutive test patterns are distinct that is, that $d_j > 0$ for all j.

Given this assumption, if test pattern matrix C is used in combination with an SSOL constraint s, then $\lceil d_j/s \rceil - 1$ test patterns have to be inserted between $p_j$ and $p_{j+1}$. Hence, after insertion the total number of test patterns $P_s$ required under SSOL constraint s based on the given test set satisfies the following:

$$p_s = b + \sum_{j=1}^{b-1}\left(\left\lceil \frac{d_j}{s} \right\rceil - 1\right) = 1 + \sum_{j=1}^{b-1}\left\lceil \frac{d_j}{s} \right\rceil.$$

Let $\tau_i$, for i=1 ... k, denote the number of transitions in code word $c_i$, i.e., $\tau_i = \#\{j \in \{1, \ldots, b-1\} | C_{i,j} \neq C_{i,j+1}\}$.

The aim is to derive lower and upper bounds for the total number of test patterns $P_s$, in terms of the total number of transitions $\tau_{tot} = \sum_{i=1}^{k} \tau_i$ in the test pattern matrix C. The analysis is based on the definition of the total distance $d_{tot}$ of the test by:

$$d_{tot} = \sum_{j=1}^{b-1} d_j$$

The total number of transitions in a row of test pattern matrix C is given by number of ones in the corresponding row of transition matrix T. The Hamming distance between consecutive test patterns is given by the number of ones in the relevant column of transition matrix T. Accordingly, both $\tau_{tot}$ and $d_{tot}$ count the total number of ones in the transition matrix T; one does so by rows and the other by columns.

Formally, $$\tau_{tot} = \sum_{i=1}^{k} \tau_i$$
$$= \sum_{i=1}^{k} \sum_{j=1}^{b-1} T_{i,j}$$
$$= \sum_{j=1}^{b-1} \sum_{i=1}^{k} T_{i,j}$$
$$= \sum_{j=1}^{b-1} d_H(p_j, p_{j+1})$$
$$= \sum_{j=1}^{b-1} d_j$$
$$= d_{tot}$$

The fact that total Hamming distance is equal to the total number of transition can be used to derive upper and lower bounds for $P_s$ that depend only on $\tau_{tot}$.

A test pattern set consisting of code words of length b contains a total of $\tau_{tot}$ transitions. The total number $P_s$ of test patterns, after insertions, to satisfy an SSOL constraint s is then given by:

$$1 + \left\lceil \frac{\tau_{tot}}{s} \right\rceil \leq p_s \leq \left\lfloor \frac{\tau_{tot}}{s} \right\rfloor + b.$$

The proof of this expression is given below.

Let $\tau_{tot} = qs - r$, with $0 \leq r < s$. For each j, let $d_j = q_j s - r_j$ with $0 \leq r_j < s$.

According to expression given above, $$\tau_{tot} = d_{tot} = \sum_{j=1}^{b-1} d_j = s \sum_{j=1}^{b-1} q_j - \sum_{j=1}^{b-1} r_j.$$

From this follows $$\sum_{j=1}^{b-1} q_j = \frac{\tau_{tot} + \sum_{j=1}^{b-1} r_j}{s}$$

and since $\lceil d_j/s \rceil = q_j$, $$P_s = 1 + \sum_{j=1}^{b-1} \left\lceil \frac{d_j}{s} \right\rceil = 1 + \sum_{j=1}^{b-1} q_j = 1 + \frac{\tau_{tot} + \sum_{j=1}^{b-1} r_j}{s}.$$

As a consequence $$P_s = 1 + \frac{\tau_{tot} + \sum_{j=1}^{b-1} r_j}{s} \geq 1 + \frac{\tau_{tot}}{s}$$

and $$P_s = 1 + \frac{\tau_{tot} + \sum_{j=1}^{b-1} r_j}{s} \geq 1 + \frac{\tau_{tot} + (b-1)s}{s} \leq \frac{\tau_{tot}}{s} + b.$$

Since $P_s$ is an integer, the theorem follows.

From this theorem, it is concluded that for fixed code word length b, the total number of test patterns after insertion under an SSOL constraint s can be small only by using a collection of code words for which the total number of transitions is small.

Accordingly an embodiment of the present invention seeks to minimize the total number of transitions in the test pattern matrix C.

A further aspect of the present invention will now be described. This aspect results in a method that enables the choice of an almost optimal set of k code words of any fixed length b, which minimizes the total number of test patterns required under an SSOL constraint s. In order to have at least k code words available, $2^b \geq k$. So, it is assumed that $b \geq b_{min} = \lceil \log_2 k \rceil$.

This aspect of the present invention uses the following code word selection method. Choose all words with 0 transitions, then all words with 1 transition, up to all words with t−1 transitions, and finally some additional words with t transitions. Here t is such that the number k of required code words is larger than the number of words of length b with at most t−1 transitions, but not larger than the number of words of length b with at most t transitions.

Figure 8B:
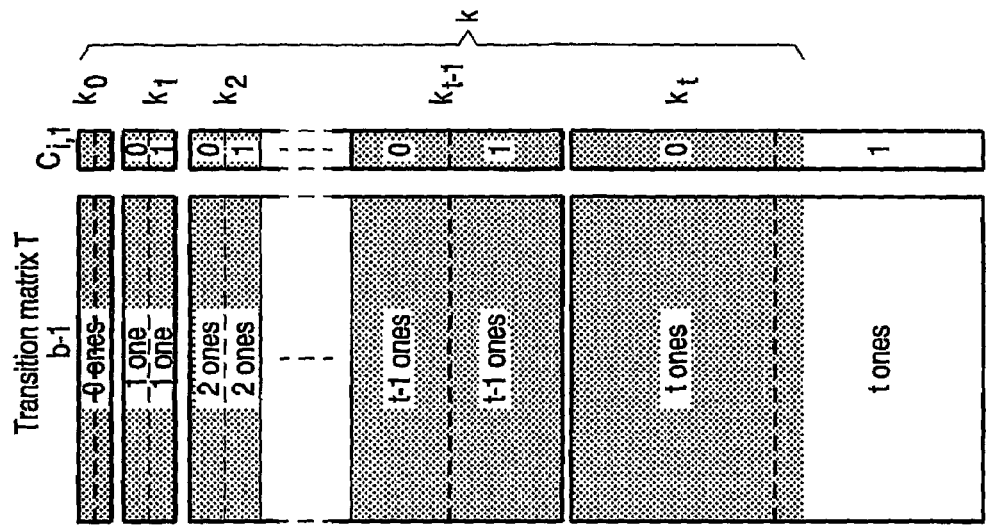
FIG. 8A-8B illustrates selection of code words.
Figure 8A:
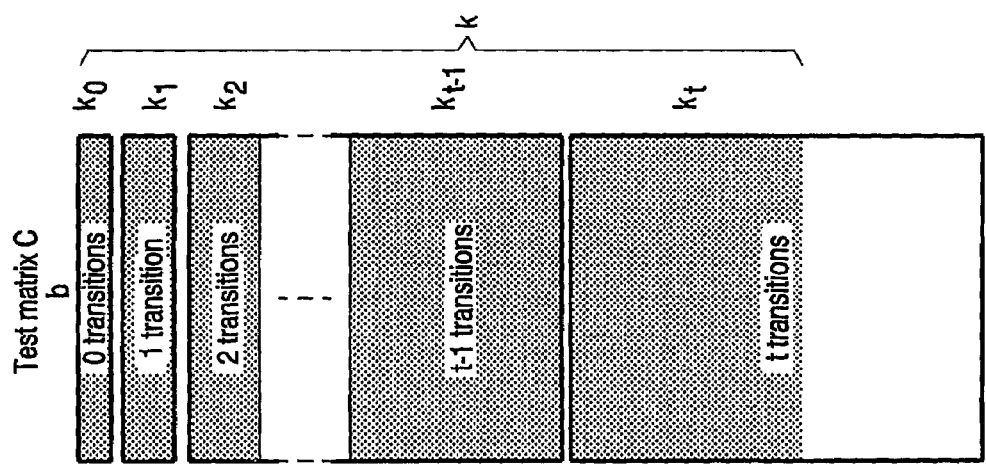

This technique is illustrated in FIG. 8, where the test pattern matrix C and the transition matrix T are shown. The rows of the two matrices are ordered from zero transitions (matrix C) or zero ones (matrix T) at the top to t transitions or ones at the bottom of the Fig. In accordance with this embodiment of the invention the code words are selected from the top of the matrices, downwards until the required number of k code words have been selected. For both test set representations, the fig. shows by means of gray shading which code words are generated.

It is useful to note that that total number of transitions in a test pattern set chosen in this way does not depend on the choice of particular code words with t transitions, and is by construction the minimal number of transitions in any set of k code words of length b. This is denoted by $\tau_{tot}(b)$.

In order to analyze algorithms based on this method and to be able to compute $\tau_{tot}(b)$, the following result is required:

The number of words of length b−1 with precisely i ones is equal to $$\binom{b-1}{i}.$$

Figure 7B:
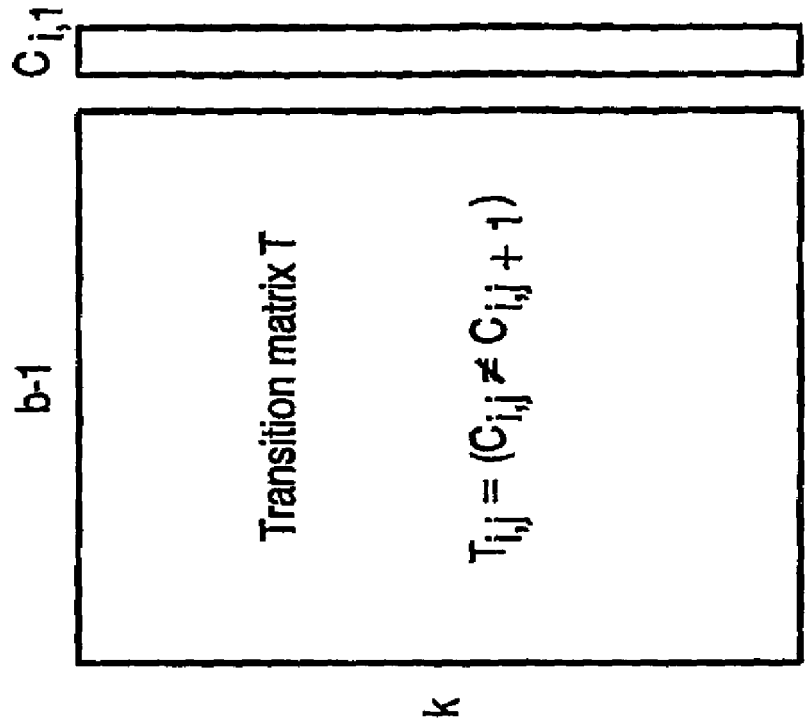
FIG. 7A-7B illustrates a test matrix and a transition matrix.
Figure 7A:
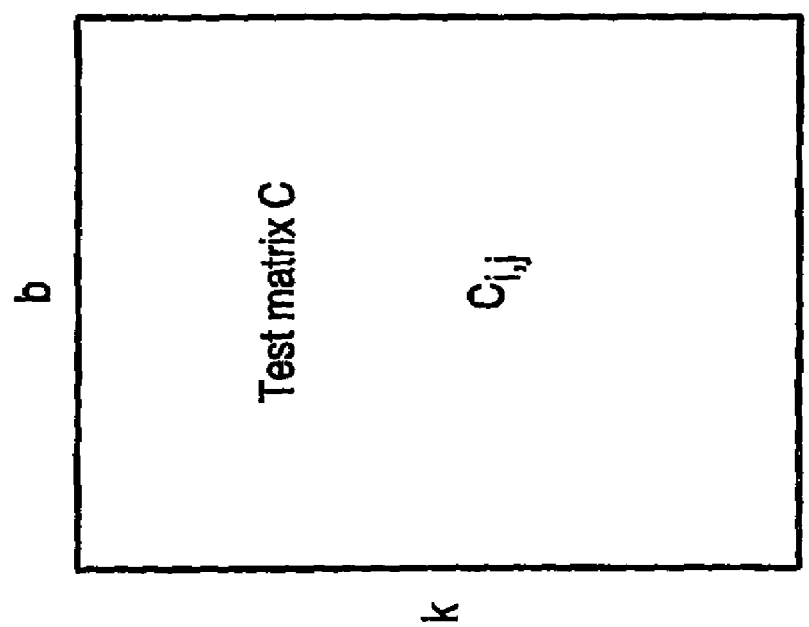

From the correspondence between the k×b code word matrix C and the k×(b−1) transition matrix T as indicated in FIG. 7, it can be seen that each of these words corresponds to precisely two code words with i transitions.

Let $k_i$ be the number of code words with i transitions that are included in the test set. In order to minimize the total number of transitions $\Sigma_i i k_i$ in the test set, the code word selection method chooses as code words all words containing at most t−1 transitions, and some of the words containing t transitions. So $$k_i = \binom{b-1}{i}$$

for $0 \leq i \leq t-1$ and t is such that $$k = \sum_{i=0}^{t} k_i$$
$$= \sum_{i=0}^{t-1} 2\binom{b-1}{i} + k_t, \text{ with } 0 < k_t \leq 2\binom{b-1}{t}.$$

For $\tau_{tot}(b)$ we now obtain the expression $$\tau_{tot}(b) = \sum_{i=0}^{t} i k_i$$
$$= \sum_{i=0}^{t-1} i \cdot 2\binom{b-1}{i} + t \cdot k_t$$

This code word selection method is used to derive bounds on the minimal number of test patterns p(k, s, b) required in a test set for k nets, using code words of length b, and satisfying an SSOL constraint s. Since it was shown above that there exists a test set (in fact, many test sets) using code words of length b for which $\tau_{tot} = \tau_{tot}(b)$ and since obviously no such test can have a similar value of $\tau_{tot}$, it can be concluded that:

$$1 + \left\lceil \frac{\tau_{tot}(b)}{s} \right\rceil \leq p(k, s, b) \leq b + \left\lfloor \frac{\tau_{tot}(b)}{s} \right\rfloor$$

Note that any algorithm using this code word selection method and some specific method to choose the $k_t$ additional code words achieves a total number of test patterns after insertion that lies within the bounds of this equation.

In particular, this holds for the Transition-Count code word subset selection heuristic algorithm in Marinissen et al.

In embodiments of the present invention, the upper bound this equation is improved by using an algorithm that has an improved worst-case behavior. The algorithm makes use of the following relationship:

$$\max\left(b, 1 + \left\lceil \frac{\tau_{tot}(b)}{s} \right\rceil\right) \leq p(k, s, b) \leq 1 + (b-1)\left\lceil \frac{\tau_{tot}(b)}{[b-1]s} \right\rceil$$

where k and b are fixed.

There will now be described an algorithm based on the code word selection method which produces at most $$1 + (b-1)\left\lceil \frac{\tau_{tot}(b)}{(b-1)s} \right\rceil$$

test patterns satisfying SSOL s, thus establishing the upper bound.

The idea behind this algorithm is the following. The resulting distances $d_j$ after choosing the $k_t$ additional code words determine the resulting number of test patterns after insertion. Due to the code word selection method, the total distance $$d_{tot} = \sum_{j=1}^{b-1} d_j$$

will always be the same (namely $\tau_{tot}(b)$), but the precise value of the distances $d_j$ depend on the choice of the additional $k_t$ code words. It is desirable to avoid the situation where all $d_j$ are slightly above a multiple of s, which is the worst-case behavior on which the upper bound is based.

Preferably, all $d_j$ should equal to or slightly below a multiple of s, but this seems difficult to guarantee in general. The worst-case behavior is avoided by ensuring that the distances $d_j$ are all about equal. In what follows, it is first shown that the part of the distances $d_j$ on code words with at most t−1 transitions is in fact constant, independent of j. Then, it is explained how to choose the remaining $k_t$ code words such that the $d_j$ remain about equal.

Given $$d_j = \sum_{l=0}^{t} d_{j,l},$$

where $d_{j,l}$ is the part of the Hamming distance between $d_j$ and $d_{j+1}$ on code words containing l transitions, that is $$d_{j,l} = \#\{i \in \{1, \ldots, k\} | C_{i,j} \neq C_{i,j+1} \text{ and } \tau_i = l\}$$

There are only two code words with 0 transitions, i.e. the all-zero and the all-one code word, and hence $d_{j,0}=0$. The number of words in T of length b−1 with l ones that contain a 1 in a given position $j\in\{1, \ldots, b-1\}$ is $$\binom{b-2}{l-1}.$$

Since each such word T corresponds to two code words in C (one beginning with a 0, the other with a 1) with l transitions that each contribute one to $d_{j,e}$, the result follows.

As a consequence, $$d_j = \sum_{l=0}^{t} d_{j,e}$$
$$= \sum_{l=0}^{t-1} 2\binom{b-2}{l-1} + d_{j,t}$$

The choice of $k_t$ code words containing t transitions will now be described. In the case $$k_t \geq \binom{b-1}{t},$$

all words with t transitions and starting with a zero are chosen in addition. It is important to note that the part of the distances $d_j$ due to code words chosen up to now is constant, independent of j. Now, let $k_t^*$ be defined by $$k_t^* = \begin{cases} k_t, & \text{if } 0 \leq k_t < \binom{b-1}{t}; \\ k_t - \binom{b-1}{t}, & \text{otherwise.} \end{cases}$$

For later use, it is to be noted that $$0 \leq k_t^* \leq \binom{b-1}{t}.$$

Then, it is still necessary to choose $k_t^*$ additional code words t transitions (all starting with 0 if $$k_t < \binom{b-2}{t}$$

and with 1 if $$k_t \geq \binom{b-1}{t}),$$

or, equivalently, $k_t^*$ words of length b−1 containing t ones (representing the transitions in the code words). For convenience, words of length b−1 containing t ones with subsets of $\{1, \ldots, b-1\}$ of size t are identified. Then, in terms of sets, it is still necessary to choose $k_t^*$ distinct subsets of size t from $\{1, \ldots, b-1\}$. Note that the (variable) part of the distance $d_j$ on positions corresponding to these $k_t^*$ words becomes, in the terms of sets, the frequency $f_j$ of the occurrence of the element j in these $k_t^*$ sets. The following definition is therefore needed. A vector $f=(f_1, \ldots, f_n)$ is called balanced if there is an integer e such that $f_i \in \{e, e+1\}$ for all $i=1, \ldots, n$.

It is now ensured that the remaining $k_t^*$ code words are chosen in such a way that the part of the distances $d_j$ on these $k_t^*$ code words is balanced. That is, in terms of sets, it is ensured that the frequencies $f_j$ are balanced. The algorithm is based on the following result.

Let $1 \leq t \leq n$. Suppose there is a balanced integer vector $f=(f_1, \ldots, f_n)$ with weight $f_1 + \ldots + f_n = mt$ such that $$0 \leq m \leq \binom{m}{t}.$$

Then there is a collection $S=\{S_1, \ldots, S_m\}$ of m distinct subsets of size t of $\{1, \ldots, n\}$ such that each i occurs in $f_i$ of the sets $S_j$.

Figure 9:
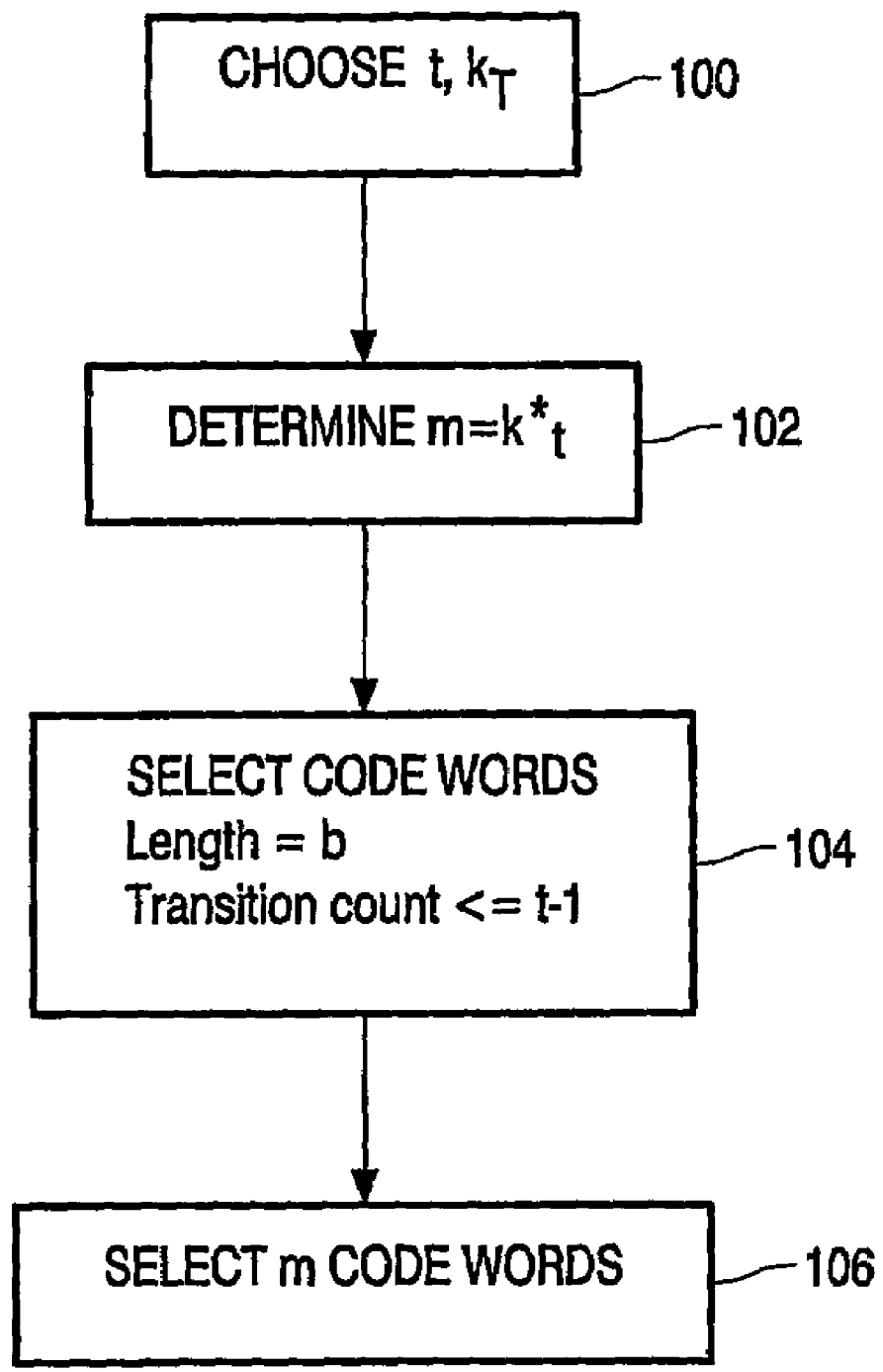
FIG. 9 illustrates a method embodying the present invention.

The algorithm embodying this aspect of the present invention performs the following functions, and is illustrated in FIG. 9. First, at step 100, choose numbers t and $k_t$ according to:

$$k = \sum_{i=0}^{t} k_i = \sum_{i=0}^{t-1} 2\binom{b-1}{i} + k_t, \text{ with } 0 < k_t \leq 2\binom{b-1}{t}$$

Next, at step 102, determine the number $m=k_t^*$ from:

$$k_t^* = \begin{cases} k_t, & \text{if } 0 \leq k_t < \binom{b-1}{t}; \\ k_t - \binom{b-1}{t}, & \text{otherwise.} \end{cases}$$

Next, at step 104, a selection of code words of length b with at most t−1 transitions is made, and if $m<k_t$ also all words of length b with t transitions and beginning with a 1.

Finally, at step 106, another m words of length b with t transitions and beginning with a 0 (if $m<k_t$) or a 1 (if $m \geq k_t$. Here, if $mt=q(b-1)+r$, $f_i=q+1$ is chosen for r indices i and $f_i=q$ for the remaining b−1−r indices i. This algorithm then ensures that the distances $d_j$ will be balanced. This method can be referred to as "ATPG for Fixed Code Word Length".

Now, the average Hamming distance is equal to $\tau_{tot}(b)/(b-1)$; hence $d_j \leq \lceil \tau_{tot}(b)/(b-1) \rceil$ and therefore $$\left\lceil \frac{d_j}{s} \right\rceil \leq \left\lceil \frac{\tau_{tot}(b)}{(b-1)s} \right\rceil$$

It is therefore possible to conclude that this algorithm produces a test set such that, after insertions to satisfy an SSOL constraint s, the total number of patterns is (at most)

$$1 + (b-1) \leq \frac{\tau_{tot}(b)}{(b-1)s},$$

thus proving the upper bound.

Above it was remarked that in order to have at least k code words available, the code word length b has to be chosen such that $b \geq b_{min} = \lceil \log_2 k \rceil$. However, if b is chosen to equal this minimum $b_{min}$, then necessarily a lot of code words contain many transitions.

The number of available code words of length b with i transitions is given by $$2\binom{b-1}{i}.$$

Hence the number of available code words with i transitions increases when the value of b increases. So it is concluded that by choosing k code words containing the minimum number of transitions as in the code word selection method above, the resulting number of transitions $\tau_{tot}(b)$, and hence certainly the quantity $\tau_{tot}(b)/(b-1)$, decreases with increasing b.

This proposition can be set out as follows: the function $\tau_{tot}(b)$ is a decreasing function of b for $\geq b_{min}$, that is, if $\geq b_{min} \leq b < b'$, then $\tau_{tot}(b) \geq \tau_{tot}(b) \geq \tau_{tot}(b')$.

This observation suggests that $$p(k, s) = \min_{b \geq b_{min}} p(k, s, b)$$

the minimal number of test patterns required in any test set for k nets and satisfying an SSOL constraint s, is realized for a value b that is often much larger than $b_{min}$.

To indicate the behavior of the bounds mentioned above for varying b, FIG. 9 shows for k=6000 and s=600 both the upper bound $$U(b) = 1 + (b-1)\left\lceil \frac{\tau_{tot}(b)}{(b-1)s} \right\rceil$$

and one of the lower bounds $$L(b) = 1 + \left\lceil \frac{\tau_{tot}(b)}{s} \right\rceil,$$

for $b \geq b_{min}$.

The best choice for b is close to the first (smallest) value b* of b for which the average distance $\tau_{tot}(b)/(b-1)$ is at most s. Note that for this value b*, U(b*)=b*. Below, an estimate is given of the value of b* and hence for corresponding total number of test patterns p(k, s, b)=b*, given k and s.

Let the number k of code words and the SSOL value s be fixed. As we saw earlier, for each b the value of t is chosen such that $$k \approx 2\binom{b-1}{t}$$

so that by Stirling's approximation:

$$\log_2 k \approx 1 + (-1)h(t/(b-1))$$

where $h(x) = -x \log_2 x - (1-x)\log_2(1-x)$.

Also, for the total distance:

$$d_{tot} = \tau_{tot} \approx tk$$

So $d_{tot} \approx (b-1)s$ if $$t/(b-1) \approx s/k$$

Combining these equations gives:

$$P^* = b^* \approx 1 + (-1 + \log_2 k)/h(s/k)$$

As it turns out, this estimate for b* is somewhat too small, but always at least about 80% of the true value.

Somewhat surprisingly, it turns out that the optimal value of b, that is, the value of b that minimizes p(k, s, b), is in fact always equal to the number b* as defined above, that is, the following result occurs.

Let k and s be positive integers, with $k \geq 2$. Define the function $\tau_{tot}(b)$ to be:

$$\tau_{tot}(b) = \sum_{i=0}^{t} ik_i = \sum_{i=0}^{t-1} i \cdot 2\binom{b-1}{i} + t \cdot k_t$$

Let $b_{min} = \lceil \log_2 k \rceil$, and define the number b* to be the smallest integer $b \geq b_{min}$ for which $\tau_{tot}(b) \leq (b-1)s$. Then the minimum number p(k, s) of test patterns required in any test set for k nets and satisfying an SSOL constraint s satisfies p(k, s)=b*.

Figure 10:
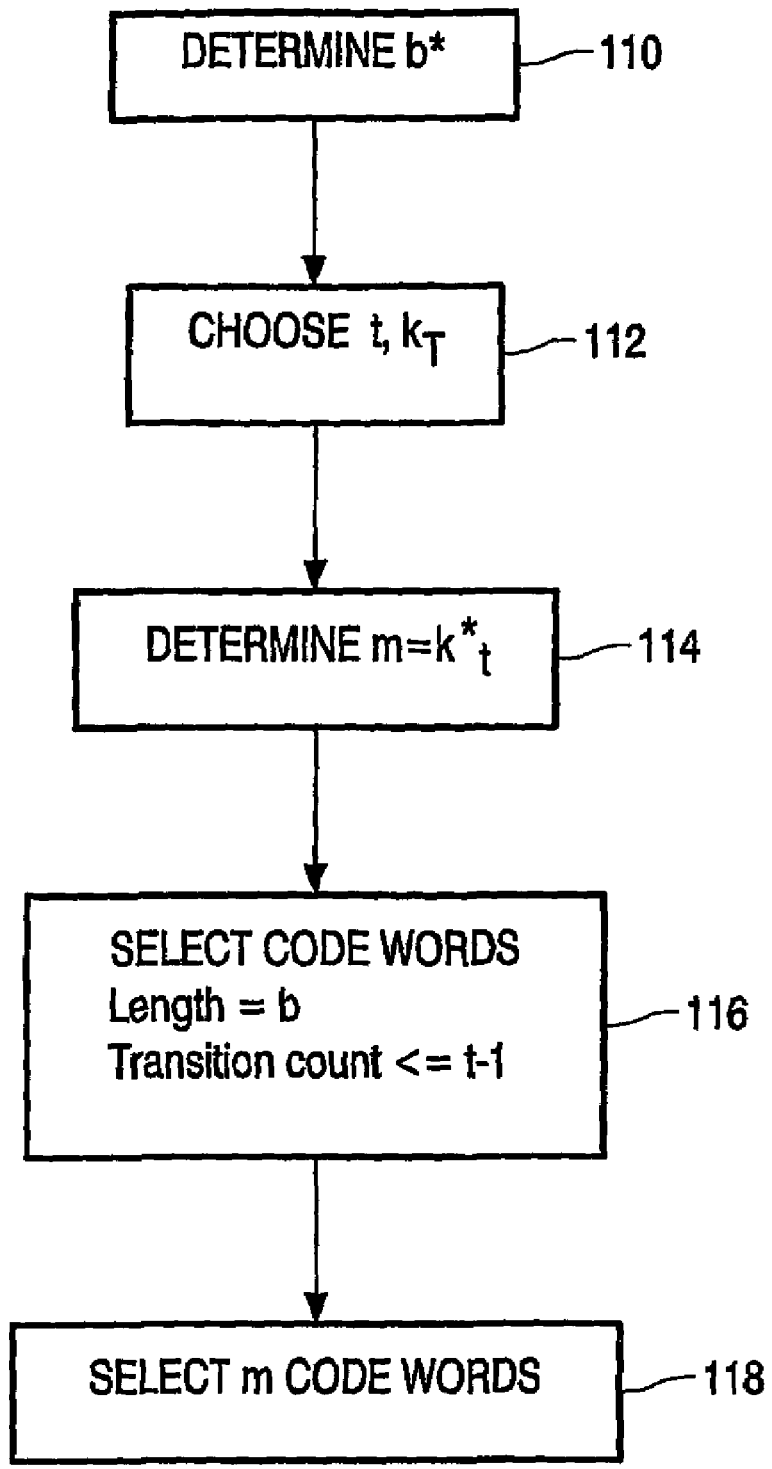
FIG. 10 illustrates another method embodying the present invention.
Figure 11:
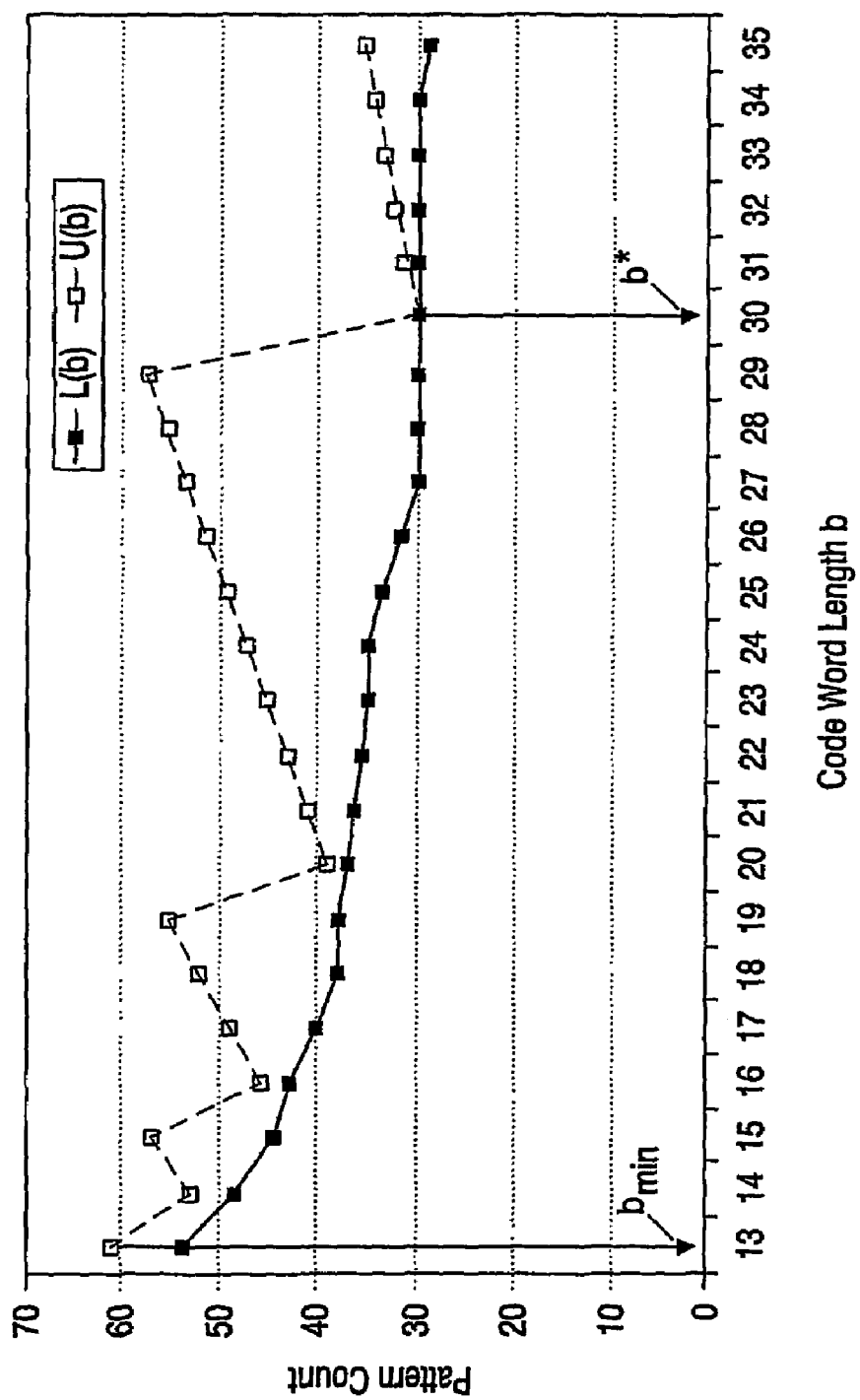
FIG. 11 illustrates code word length selection.

As a result of this theorem, to generate a test set for k nets that satisfies an SSOL constraint s and contains a minimum number of test patterns, an embodiment of another aspect of the present invention is illustrated in FIG. 10, and proceeds as follows.

Firstly, at step 110, determine the number b* as defined above. Then apply the fixed code word length algorithm as described above, with the code words having the fixed length b*.

Next, at step 112, choose numbers t and $k_t$ according to:

$$k = \sum_{i=0}^{t} k_t = \sum_{i=0}^{t-1} 2\binom{b^*-1}{i} + k_t, \text{ with } 0 < k_t \leq 2\binom{b^*-1}{t}$$

Next, at step 114, determine the number $m=k_t^*$ from:

$$k_t^* = \begin{cases} k_t, & \text{if } 0 \leq k_t < \binom{b^*-1}{t}; \\ k_t - \binom{b^*-1}{t}, & \text{otherwise.} \end{cases}$$

Next, at step 116, a selection of code words of length b* with at most t−1 transitions is made, and if m<$k_t$ also all words of length b* with t transitions and beginning with a 1. Finally, at step 118, another m words of length b* with t transitions and beginning with a 0 (if m<$k_t$) or a 1 (if m≧$k_t$). Here, if mt=q (b*−1)+r, $f_i$=q+1 is chosen for r indices i and $f_i$=q for the remaining b*−1−r indices i. This algorithm then ensures that the distances $d_j$ will be balanced.

This method generates a test pattern set with b* patterns where consecutive patterns have a distance of at most s. The method can be referred to as "ATPG for Variable Code Word Length".

Experimental results are given below for the new SSOL-constrained ATPG algorithm and compares those results against results from other methods. True/Complement Tests are used as the basis for the comparison, although the techniques cold be applied to other methods of producing test pattern sets.

In the experimental data, three methods are compared:

1. Conventional Method.

This method generates a True/Complement Test by means of conventional counting, followed by complementing. Subsequently, the SSOL constraint is met by conventional insertion of additional test patterns. This method is the basis of many professional (commercially available) tools.

2. Best Method of Marinissen et al.

This method generates a True/Complement Test by means of conventional counting, followed by complementing. Subsequently, transition-count based code word subset selection and test pattern re-ordering are applied. Remaining SSOL violations are resolved by means of conventional insertion of additional test patters. This method is the one that performed best from the various methods described in Marinissen et al.

3. ATPG for Variable Code Word Length.

Figure 13B:
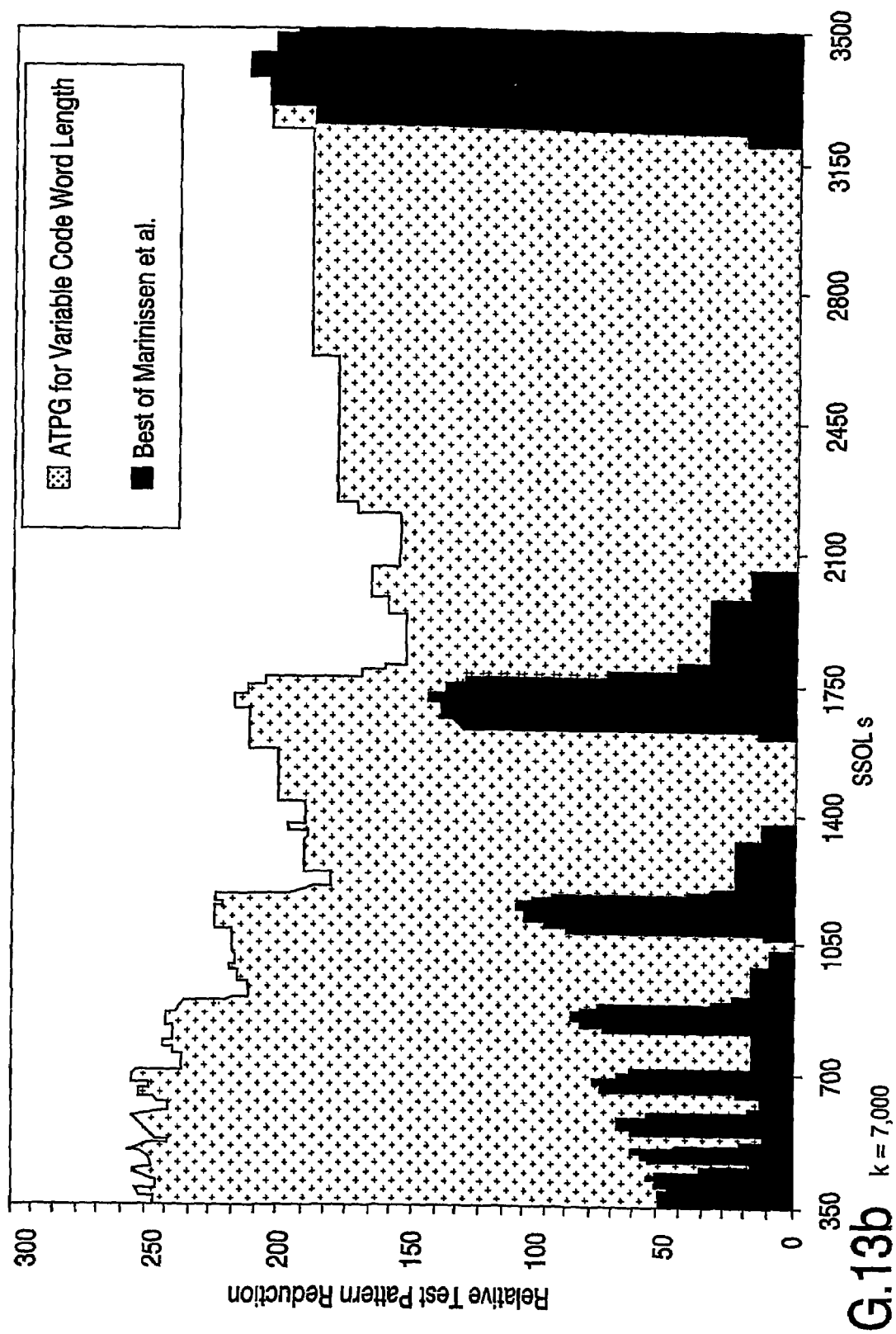
Figure 13C:
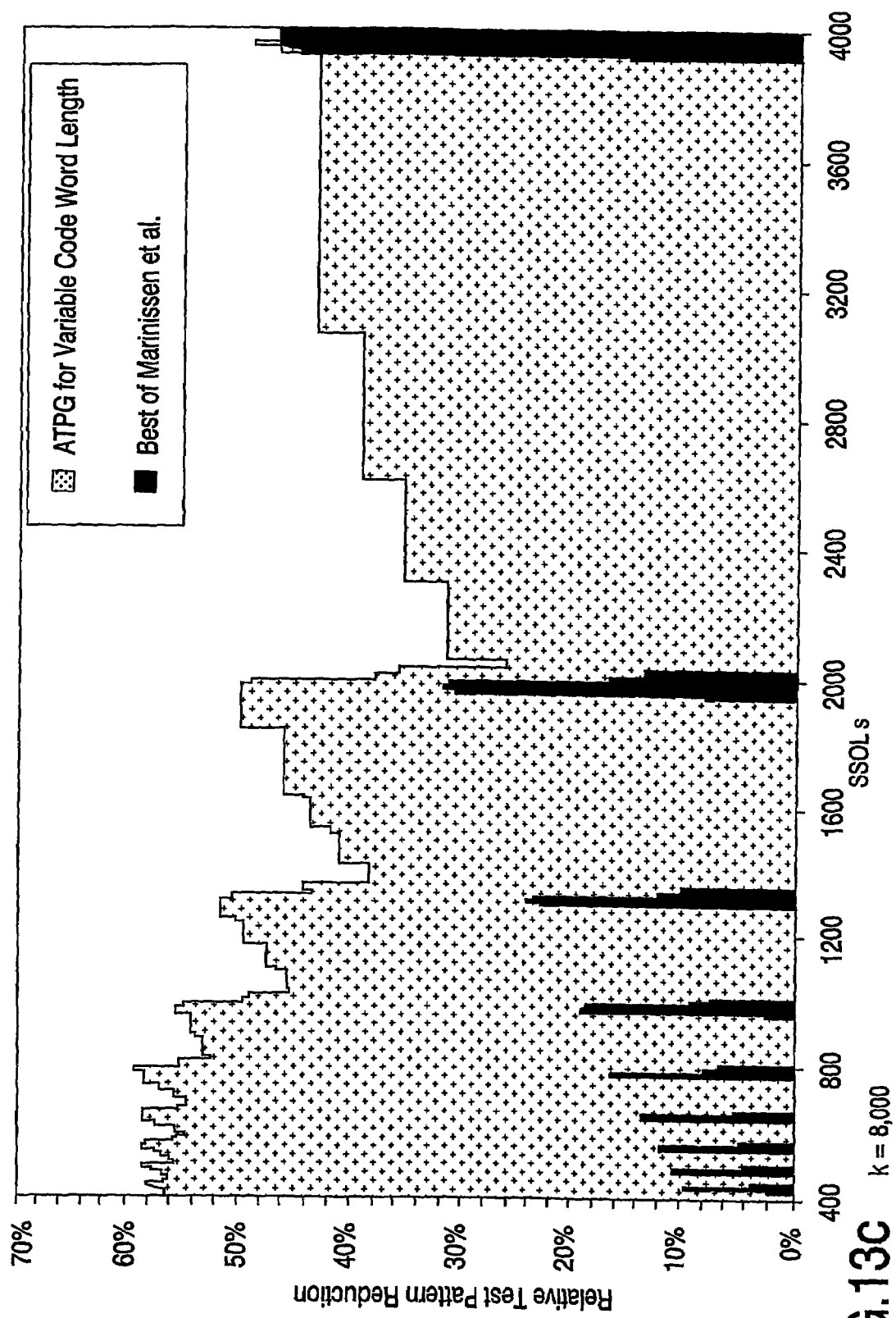
Figure 13D:
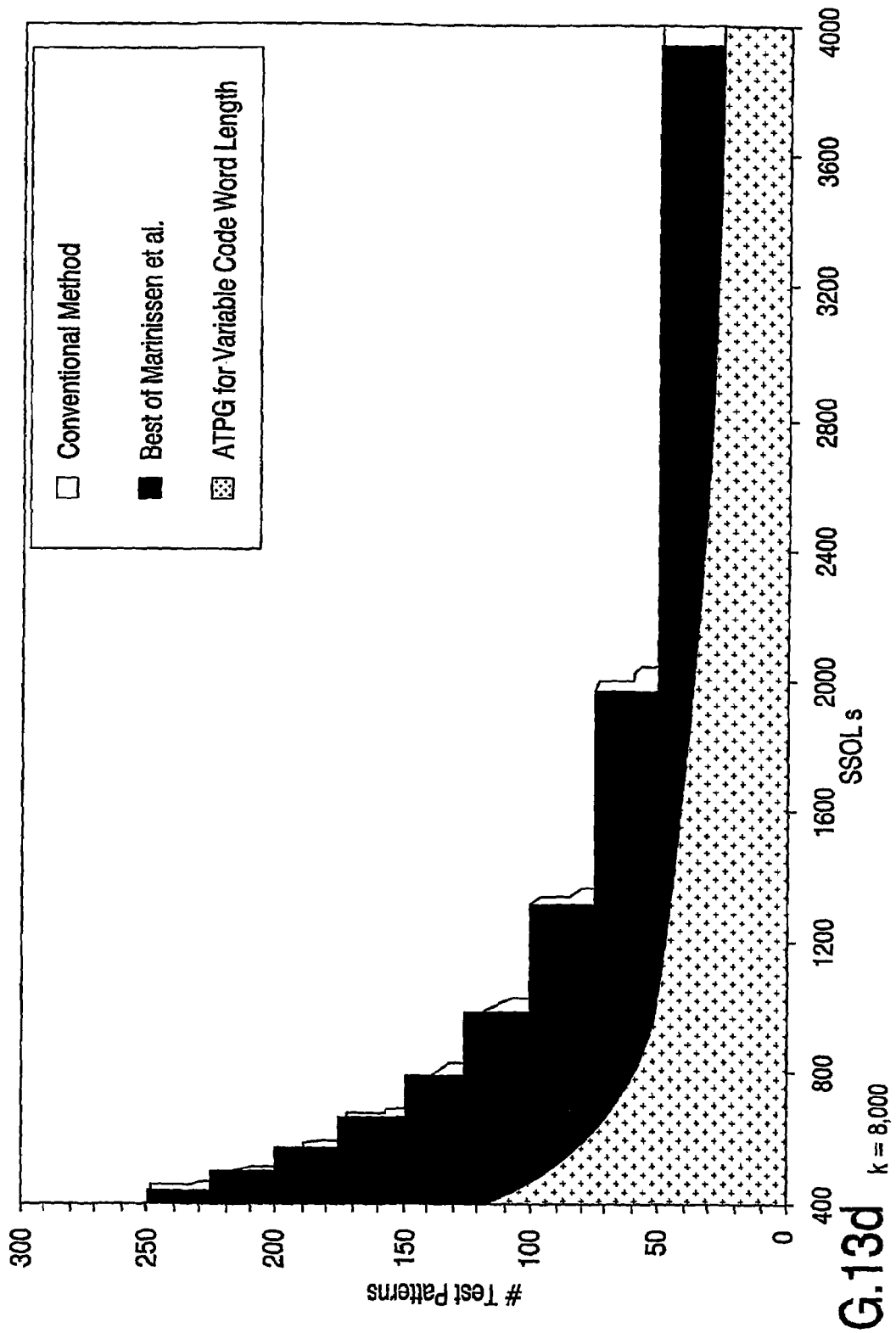

This method generates a "True" test set as described above. This test is guaranteed to be free of SSOL violations and hence does not require insertion of additional test patterns. Subsequently, the "Complement" part is generated by adding the complementary test set, which, again, is free of SSOL violations. At the border between "True" and "Complement" test patterns, usually a few additional test patterns need to be inserted. FIG. 12 shows experimental results for a problem instances with k∈{5000, 6000, 7000, 8000} nets. For SSOL value s is varying between 5% and 50% of k, FIG. 12 plots the test pattern count p(k, s) for all three methods. FIG. 13 shows the improvements in test pattern count of the previous Marinissen et al method and the new ATPG for Variable Code Word Length relative to the base-line conventional method.

FIG. 12 and 13 show that, for all SSOL values s, the conventional method yields the highest number of test patterns. For some values of k and s, the best method of Marinissen et al provides substantial improvement over the conventional method; however, there are also many values of k and s where this method does not yield any improvement at all.

The embodiment of the present invention, the new ATPG for Variable Code Word Lengths technique, clearly outperforms the other approaches; for k=5000, 6000, 7000, 8000, the average relative improvement over the conventional method is respectively 46%, 46%, 45% and 44%. The new ATPG algorithm also consistently improves on the conventional method for all values of k and s.

An optimal ATPG algorithm has been described that generates, for a user-defined number of nets k, a minimal set of test patterns p(k, s) that respect a user-defined SSOL constraint s. The algorithm is based on the following observations, which are formalized and proved above.

The number of test patterns is strongly related to the number of transitions in the code words. Hence, in order to obtain a valid test set with a small number of test patterns, we have to select code word with few transitions.

Based on the above observation, an algorithm has been presented that, for given k, s and b, chooses as code words all of length b with at most t−1 transitions and subsequently carefully selects some words of length b with t transitions, such that a total of exactly k code words is obtained, with balanced Hamming distance s between consecutive test patterns. The resulting test set consists of the test patterns thus obtained, plus additional test patterns inserted to resolve remaining SSOL violations.

A second algorithm has been presented that, for given k and s, finds a value b=b* such that if the above algorithm is invoked for this b*, it can be guaranteed that no additional test patterns need to be inserted to meet the SSOL constraint; moreover, it has been shown that this second algorithm generates provably minimal test pattern sets.

Using the commonly used True/Complement Test algorithm as an example, we have presented experimental results for k∈{5000, 6000, 7000} and s varying from 5% to 50% of k. The experiments show that the algorithm yields on average 45% reduction in the number of test patterns when compared to the conventional method.

The invention claimed is:

1. A method of generating digital test sets for use with a testing device for testing a number of wiring interconnects, each test set comprising a matrix of bits, which matrix defines a first plurality of test patterns and a second plurality of code words, wherein the bits of each test pattern are for application to respective wiring interconnects in parallel with one another, and the bits of successive test patterns for application to an interconnect form a code word for that interconnect, and wherein each code word has a transition count related to a number of bit value transitions therein, the test set having a total transition count related to the sum of the transition counts of the code words in the test set, the method comprising the steps of:

generating a test set of said test sets which has a total transition count which is less than a predetermined threshold value, the predetermined threshold value having a predetermined relationship with the number of test patterns in the test set; the step of generating the test set including, generating a test set of said test sets which includes more than $\log_2 k$ test patterns, where k is the number of wiring interconnects, and which has a total transition count which is less than a predetermined threshold value, the predetermined threshold value having a predetermined relationship with a number of test patterns in the test set, wherein
the test set includes at most $$1 + (b\text{-}1)\left\lceil \frac{\tau_{tot}(b)}{(b-1)s} \right\rceil$$

test patterns, with b being the length of the code words in the test set, $\tau_{tot}(b)$ being the total transition count, and s being a simultaneous switching output limit for the wiring interconnects.

2. A method as claimed in claim 1, wherein the number of test patterns in the test set is given by the expression:

$$P^* \approx 1+(-1+_{log_2}k)/h(s/k)$$

where P* is the number of test patterns, k is the number of wiring interconnects, s is a transition count threshold, and $h(s/k)=-(s/k)\log_2(s/k)-(1-s/k)\log_2(1-s/k)$.

3. A method as claimed in any one of claims 1, wherein the step of generating the test set comprises:
   generating a first test set which defines a first set of test patterns; and
   selecting a subset of the first set of test patterns, such that the sum of the transition counts for the code words formed by the test patterns in the subset is lower than the predetermined threshold value.

4. A method as claimed in claim 1, wherein the step of generating the test set comprises:
   generating a first test set which defines a first set of code words; and
   selecting a subset of the first set of code words, such that the sum of the transition counts for the code words in the subset is lower than the predetermined threshold value.

5. A method as claimed in claim 4, wherein the step of selecting a subset of code words comprises the steps of:
   selecting a first plurality of code words having transition count values less than a first value;
   selecting second plurality of code words having respective transition counts greater than or equal to the first value, such that the sum of the first and second pluralities of code words selected equals said number of interconnects.

6. A method as claimed in claim 1, wherein the number of code words in the test set is equal to said number of wiring interconnects.

7. A method as claimed in claim 1, further comprising adding additional test patterns to the test set.

8. A method as claimed in claim 7, wherein adding additional test patterns comprises inserting additional test patterns between pairs of test patterns of the test set that have an original transition distance greater than a threshold value, the inserted test patterns causing transition distances which are less than the original transition distance.

9. A method as claimed in claim 8, wherein the inserted test patterns cause transition distances that are less than or equal to a predetermined threshold level.

10. A method as claimed in claim 7, wherein adding additional test patterns comprises adding the complement of the test set to the test set to form a final true/complement test set.

11. A method of testing a number of wiring interconnects, the method comprising the steps of:
   applying a test set, generated in accordance with a method as claimed in claim 1, to a plurality of wiring interconnects; and
   analyzing the results of such application.

* * * * *